(12) United States Patent
Hei et al.

(10) Patent No.: US 11,508,286 B2
(45) Date of Patent: Nov. 22, 2022

(54) METHOD FOR DRIVING A DISPLAY PANEL, DISPLAY DRIVING DEVICE AND ELECTRONIC DEVICE

(71) Applicant: Wuhan Tianma Micro-Electronics Co., Ltd., Wuhan (CN)

(72) Inventors: Yajun Hei, Wuhan (CN); Jingxiong Zhou, Wuhan (CN); Ruiyuan Zhou, Wuhan (CN); Sha Lin, Shanghai (CN); Zhongjie Zhang, Shanghai (CN); Chunmei Gao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/240,223

(22) Filed: Apr. 26, 2021

(65) Prior Publication Data

US 2021/0343222 A1 Nov. 4, 2021

Related U.S. Application Data

(63) Continuation-in-part of application No. 16/734,827, filed on Jan. 6, 2020, now Pat. No. 11,018,199.

(30) Foreign Application Priority Data

Sep. 29, 2019 (CN) .......................... 201910935443.2

(51) Int. Cl.
*G09G 3/20* (2006.01)
*G06T 7/11* (2017.01)

(52) U.S. Cl.
CPC .............. *G09G 3/2074* (2013.01); *G06T 7/11* (2017.01); *G06T 2207/20021* (2013.01);
(Continued)

(58) Field of Classification Search
None
See application file for complete search history.

(56) References Cited

U.S. PATENT DOCUMENTS

2002/0149598 A1* 10/2002 Greier .................. G09G 3/3611
345/589
2006/0268212 A1   11/2006 Someya et al.
(Continued)

FOREIGN PATENT DOCUMENTS

CN          104485068 A      4/2015
CN          106486077 A      3/2017
(Continued)

OTHER PUBLICATIONS

Chinese Search Report for related Chinese Application No. 2019109354432.
(Continued)

*Primary Examiner* — Matthew Yeung
(74) *Attorney, Agent, or Firm* — von Briesen & Roper, s.c.

(57) ABSTRACT

Provided are a method for driving a display panel, a display driving device and an electronic device. The method includes: acquiring any one frame of the picture to de displayed; dividing the any one frame of the picture to be displayed into a first partition picture, a second partition picture and a third partition picture; displaying the first partition picture in the first display region, displaying the second partition picture in the second display region, and displaying the third partition picture in the third display region; where in a same frame of picture to be displayed, a density A1 of sub-pixels for displaying the first partition picture, a density A2 of sub-pixels for displaying the second partition picture and a density A3 of sub-pixels for displaying the third partition picture satisfy that $A1 \leq A2 \leq A3$; and where sub-pixels in the second display region include first sub-pixels and second sub-pixels.

21 Claims, 21 Drawing Sheets

(52) U.S. Cl.
CPC ............... *G09G 2300/0443* (2013.01); *G09G 2320/0626* (2013.01); *G09G 2320/0686* (2013.01)

(56) References Cited

U.S. PATENT DOCUMENTS

| | | | | |
|---|---|---|---|---|
| 2008/0272999 | A1* | 11/2008 | Kurokawa | ........... G09G 3/3406 |
| | | | | 345/89 |
| 2020/0234634 | A1* | 7/2020 | Li | ........................ G09G 3/3233 |
| 2021/0118403 | A1* | 4/2021 | Liu | ........................... G06F 3/14 |

FOREIGN PATENT DOCUMENTS

| | | |
|---|---|---|
| CN | 106531106 A | 3/2017 |
| CN | 107819020 A | 3/2018 |
| CN | 207264695 U | 4/2018 |
| CN | 108461521 A | 8/2018 |
| CN | 108766347 A | 11/2018 |
| CN | 109192123 A | 1/2019 |
| CN | 111223434 A | 6/2020 |

OTHER PUBLICATIONS

Chinese Office Action for related Chinese Application No. 201910935443.2 dated Feb. 24, 2021.
Chinese Office Action related to Application No. 201910935443.2; dated Sep. 9, 2021.

* cited by examiner

METHOD FOR DRIVING A DISPLAY PANEL, DISPLAY DRIVING DEVICE AND ELECTRONIC DEVICE

CROSS-REFERENCES TO RELATED APPLICATIONS

This application claims the priority to Chinese patent application No. CN201910935443.2 filed at the CNIPA on Sep. 29, 2019, the disclosure of which is incorporated herein by reference in its entirety.

TECHNICAL FIELD

The present disclosure relates to display technologies and, in particular, to a method for driving a display panel, a display driving device and an electronic device.

BACKGROUND

With the development of display technologies, more and more display panels and display devices are used in people's daily lives and work. In order to improve user experience, a display panel may be further integrated with a sensor module, such as a camera, an infrared sensor and the like, so as to integrate functions of photography, infrared detection and the like.

On this basis, in order to meet a high screen ratio, light emitting elements may be also disposed in a region of the display panel where the sensor module is disposed. After the sensor module works normally, the obvious difference between the brightness of the region where the sensor module is disposed and the brightness of a normal display region exists. As a result, a display effect of the region where the sensor module is disposed is inconsistent with a display effect of the normal display region, and a boundary between the two regions is obvious, which affects an overall display quality of a display picture.

SUMMARY

The present disclosure provides a method for driving a display panel, a display driving device and an electronic device, so as to implement the transition of a display effect of a picture to be displayed and thereby facilitate the improvement of an overall display quality of a display picture.

In a first aspect, an embodiment of the present disclosure provide a method for driving a display panel, where the display panel includes a first display region, a second display region and a third display region, where the second display region is disposed between the first display region and the third display region, at least part of the first display region is reused as an optical element reserved region. The method for driving a display panel includes steps described below.

One frame of picture to be displayed is acquired.

The picture to be displayed is divided into a first partition picture, a second partition picture and a third partition picture.

The first partition picture is displayed in the first display region, the second partition picture is displayed in the second display region, and the third partition picture is displayed in the third display region.

In response to displaying the second partition picture, sub-pixels in the second display region include first sub-pixels having display luminance L21 and second sub-pixels having display luminance L22, where L21>L22.

In a second aspect, an embodiment of the present disclosure provides a display driving device. The display driving device is configured to perform any one method for driving a display panel provided in the first aspect. The display driving device includes a picture acquisition module, a region division module and a picture display module.

The picture acquisition module is configured to acquire any one frame of picture to be displayed.

The region division module is configured to divide the any one frame of picture to be displayed into a first partition picture, a second partition picture and a third partition picture.

The picture display module is configured to display the first partition picture in the first display region, display the second partition picture in the second display region, and display the third partition picture in the third display region.

In a third aspect, an embodiment of the present disclosure further provides an electronic device. The electronic device includes the display driving device provided in the second aspect.

DETAILED DESCRIPTION

Figure 1:
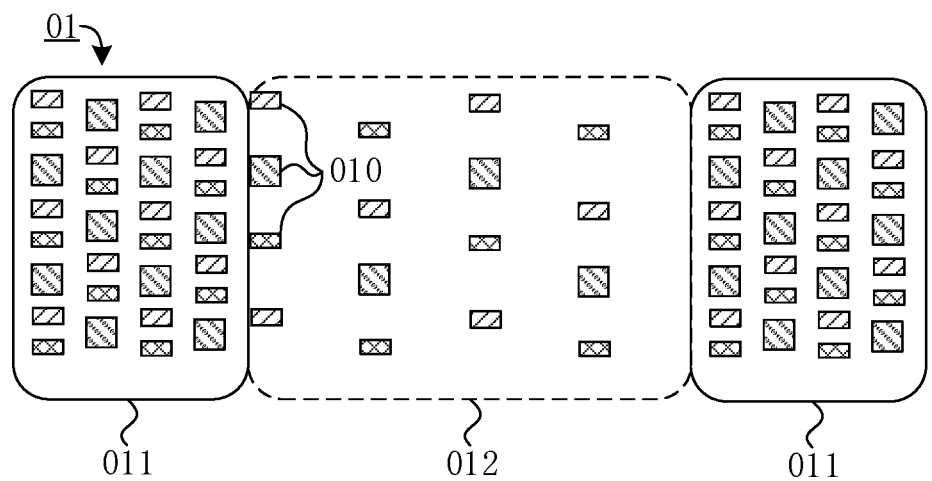
FIG. 1 is a structural diagram of a display panel in related art.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings.

To achieve a high screen ratio and integrate a display panel with a sensor module, a display panel 01 is generally configured to include a normal display region 011 and a sensor setting region 012, where the sensor setting region 012 may also be referred to as a semi-transparent region 012. Since a light emitting element 010 has a light-blocking effect, more light emitting components 010 per unit area have a more significant light-blocking effect under the consideration that all the light emitting components 010 have a same structure. Generally, a small number of light emitting elements 010 are generally disposed in the semi-transparent region 012. Referring to FIG. 1, it may also be understood that an arrangement density of the light emitting elements 010 in the semi-transparent region 012 is smaller than an arrangement density of light emitting elements 010 in the normal display region 011 to ensure that the semi-transparent region 012 has the higher light transmittance, so that more light rays can pass through the semi-transparent region 012 and reach the sensor module, so as to ensure the higher working accuracy of the sensor module.

However, when the semi-transparent region 012 adopts a same display driving algorithm as the normal display region 010, because the arrangement density of the light emitting elements 010 in the semi-transparent region 012 is different from the arrangement density of the light emitting elements 010 in the normal display region 011, the semi-transparent region 012 has stronger display graininess and/or lower display luminance while the normal display region 011 may display a picture with more fineness, resulting in so significant a boundary between the semi-transparent region 012 and the normal display region 011.

Figure 2:
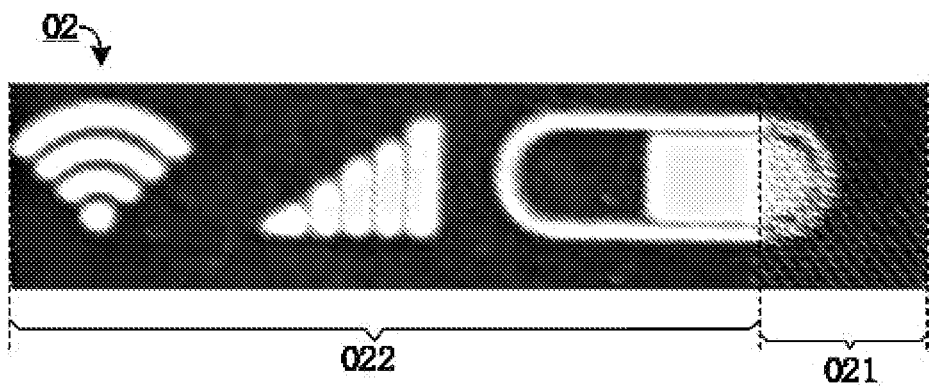
FIG. 2 is a diagram illustrating a display effect of the display panel in FIG. 1.

Exemplarily, a partial display picture 02 shown in FIG. 2 may include a semi-transparent region picture 021 and a normal region picture 022; it is visually visible that the semi-transparent region picture 021 has the stronger display graininess and/or the lower display luminance; and a boundary between the semi-transparent region picture 021 and the normal region picture 022 is very significant, which results in a poor overall display effect (i.e., display quality) of the display panel 01.

In view of the above problems, embodiments of the present disclosure provide a method for driving a display panel, a display driving device and an electronic device. It is set that a picture to be displayed includes a first partition picture, a second partition picture and a third partition picture, where the second partition picture is located between the first partition picture and the third partition picture, and a density of sub-pixels for displaying the second partition picture is between a density of sub-pixels for displaying the first partition picture and a density of sub-pixels for displaying the third partition picture, and that sub-pixels in a second display region for displaying the second partition picture including first sub-pixels with higher display luminance and second sub-pixels with lower display luminance, so that the transition of a display effect (including luminance and graininess) between the first partition picture and the third partition picture can be implemented by using the second partition picture, and the boundary between the semi-transparent region and the normal display region can be weakened, thereby improving the overall display quality.

The method for driving a display panel, the display driving device, and the electronic device according to the embodiments of the present disclosure are exemplarily described below in conjunction with FIG. 2 to FIG. 25.

Figure 4:
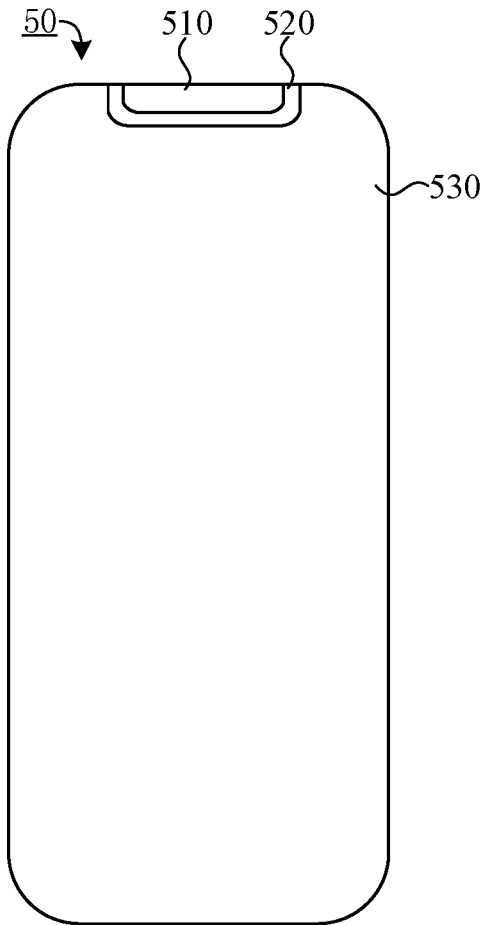
FIG. 4 is a structural diagram of a display panel according to an embodiment of the present disclosure.
Figure 5:
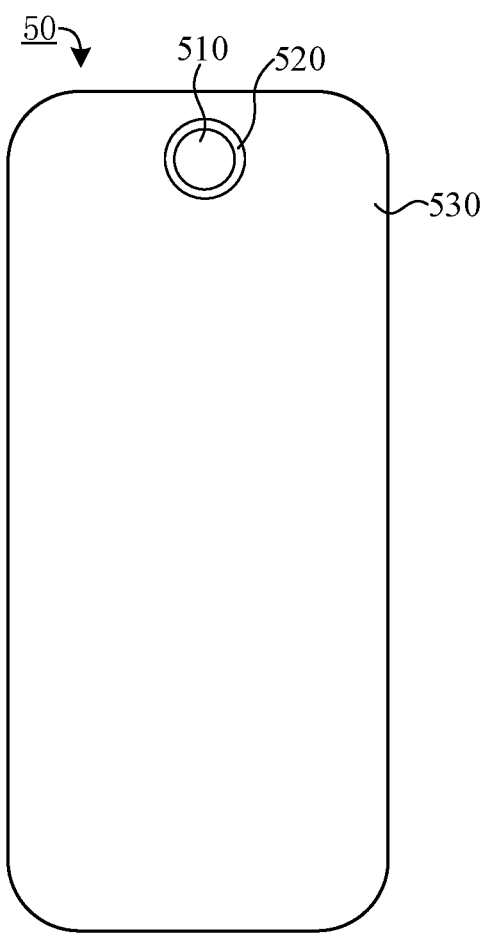
FIG. 5 is a structural diagram of another display panel according to an embodiment of the present disclosure.
Figure 6:
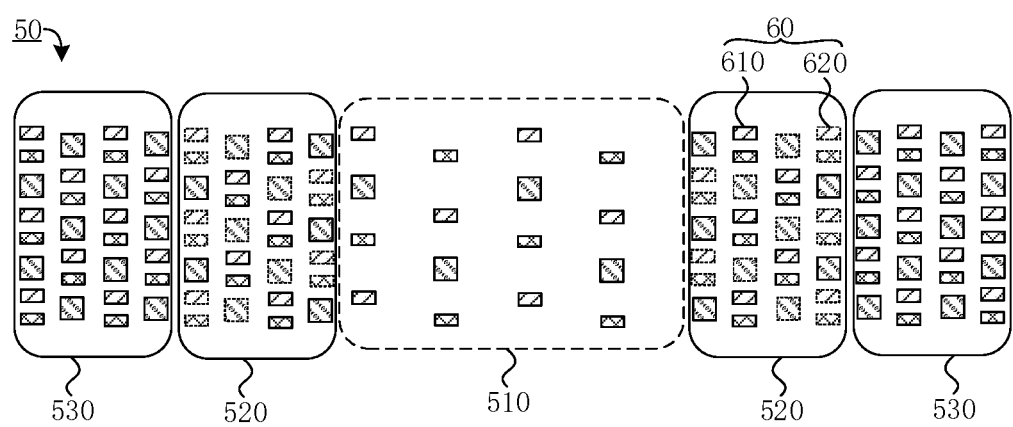
FIG. 6 is a schematic diagram of a partitioning manner of a display panel according to an embodiment of the present disclosure.

Exemplarily, referring to FIG. 4 and FIG. 6, or referring to FIG. 5 and FIG. 6, a display panel 50 includes a first display region 510, a second display region 520 and a third display region 530, where the second display region 520 is disposed between the first display region 510 and the third display region 530, at least part of the first display region 510 is reused as an optical element reserved region. Specifically, in an optional embodiment, referring to FIG. 6, a sub-pixel arrangement density of the first display region 510 is less than a sub-pixel arrangement density of the second display region 520 and a sub-pixel arrangement density of the third display region 530, and the sub-pixel arrangement density of the second display region 520 is equal to the sub-pixel arrangement density of the third display region 530. It should be noted that the first display region 510 includes a plurality of first light emitting elements, the second display region 520 includes a plurality of second light emitting elements, and the third display region 530 includes a plurality of third light emitting elements. It is understood that a sub-pixel corresponds to a light emitting element, and an arrangement density of sub-pixels can be understood as an arrangement density of light emitting elements. Therefore, it can be concluded that the arrangement density of the first light emitting elements is smaller than the arrangement density of the second light emitting elements. The arrangement density of the second light emitting elements is equal to the arrangement density of the third light emitting elements. In the embodiment of the present disclosure, the arrangement density of the light emitting elements in the first display region is reduced, so that the light transmittance in the first display region can be increased.

Each of the light emitting elements in the display panel includes an anode, a light emitting layer, and a cathode, and different light emitting elements emit different colors of light correspondingly.

Figure 26:
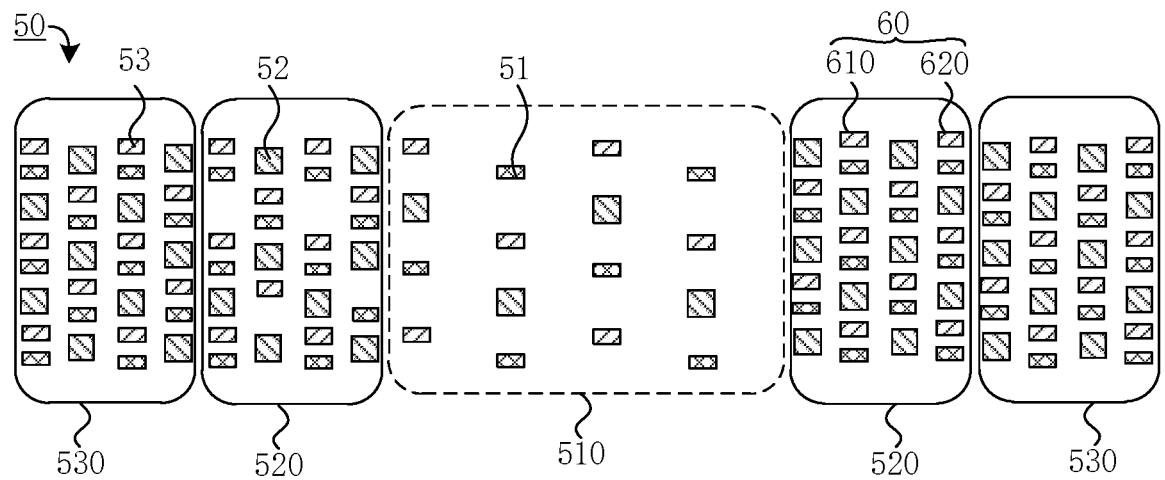
FIG. 26 is a diagram showing partial structures of a display panel according to an embodiment of the present disclosure.

In another optional embodiment, referring to FIG. 26, FIG. 26 is a diagram showing partial structures of a display panel according to an embodiment of the present disclosure. The display panel 50 includes a first display region 510, a second display region 520, and a third display region 530. The second display region 520 is disposed between the first display region 510 and the third display region 530, the first display region 510 includes a plurality of first light emitting elements 51, the second display region 520 includes a plurality of second light emitting elements 52, and the third display region 530 includes a plurality of third light emitting elements 53. Where the arrangement density of the first light emitting elements 51 is less than the arrangement density of the second light emitting elements 52, and the arrangement density of the second light emitting elements 52 is less than the arrangement density of the third light emitting elements 53. By setting the arrangement density of the light emitting elements to a transitional arrangement manner, the graininess of the display picture can be improved, and a smooth display picture effect can be formed.

Figure 27:
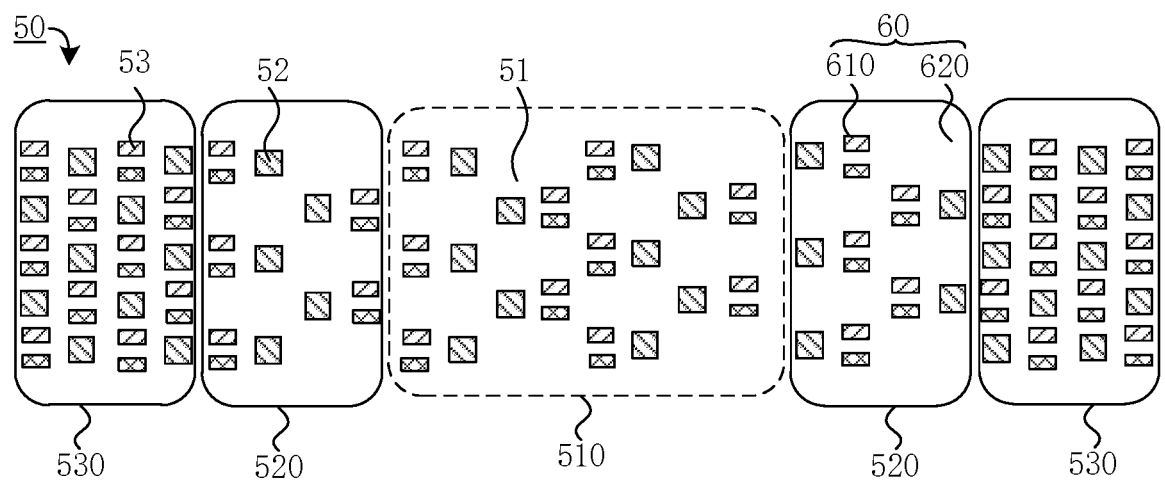
FIG. 27 is a diagram showing partial structures of another display panel according to an embodiment of the present disclosure.

In another optional embodiment, referring to FIG. 27, FIG. 27 is a diagram showing partial structures of another display panel according to an embodiment of the present disclosure. The display panel 50 includes a first display region 510, a second display region 520, and a third display region 530. The second display region 520 is disposed between the first display region 510 and the third display region 530, the first display region 510 includes a plurality of first light emitting elements 51, the second display region 520 includes a plurality of second light emitting elements 52, and the third display region 530 includes a plurality of third light emitting elements 53. Where the arrangement density of the first light emitting elements 51 is equal to the arrangement density of the second light emitting elements 52, and the arrangement density of the second light emitting elements 52 is less than the arrangement density of the third light emitting elements 53. In the embodiment of the present disclosure, the consistency of the display graininess in the first display region and the second display region is ensured.

Figure 28:
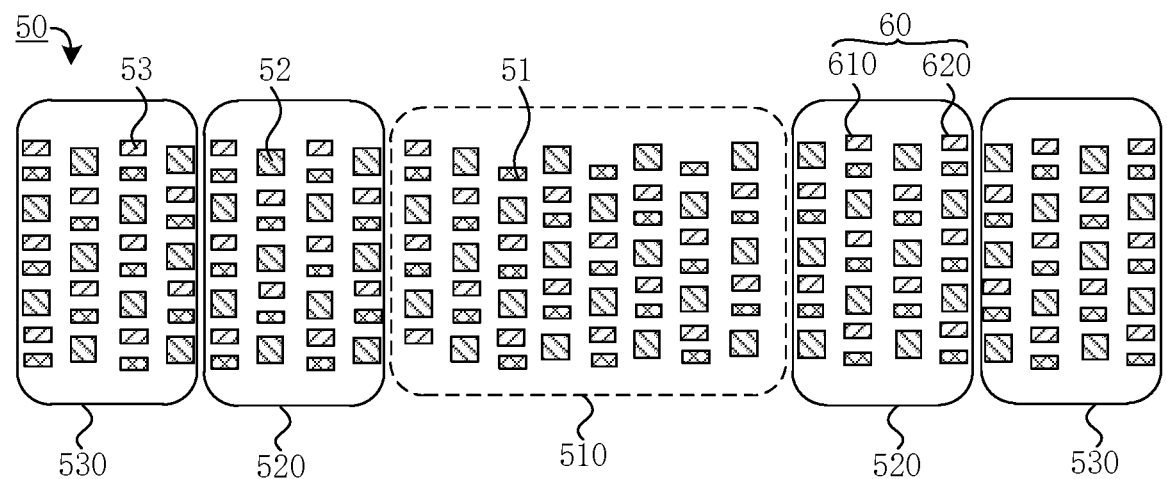
FIG. 28 is a diagram showing partial structures of another display panel according to an embodiment of the present disclosure.

In another optional embodiment, referring to FIG. 28, FIG. 28 is a diagram showing partial structures of another display panel according to an embodiment of the present disclosure, where the arrangement density of the first light emitting elements 51 is equal to the arrangement density of the second light emitting elements 52. The arrangement density of the second light emitting elements 52 is equal to the arrangement density of the third light emitting elements 53. In the embodiment of the present disclosure, the arrangement densities of the light emitting elements in the above three display regions are set to be the same to ensure that the entire uniformity of the display screen graininess in the entire display panel region.

Figure 29:
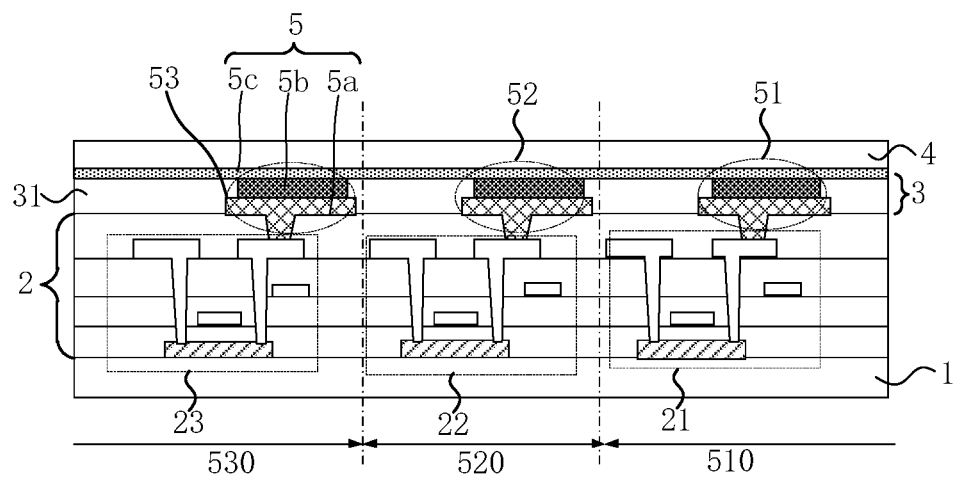
FIG. 29 is a cross-sectional view of a display panel according to an embodiment of the present disclosure.

FIG. 29 is a cross-sectional view of a display panel according to an embodiment of the present disclosure. As shown in FIG. 29, the display panel includes a substrate 1, an array layer 2, a display layer 3, and an encapsulation layer 4. Among them, a pixel circuit is provided in the array layer 2, and the pixel circuit is used to drive the light emitting element 5 in the display layer 3 to emit light. Each light emitting element 5 includes a first electrode 5a, a light emitting layer 5b, and a second electrode 5c that are sequentially stacked. The display layer 3 further includes a pixel defining layer 31, which is used to space adjacent light emitting elements 5, the pixel defining layer 31 has an opening, and the light emitting layer 5b of the light emitting element 5 is disposed in the opening. The encapsulation layer 4 is used to encapsulate and protect the light emitting element 5 in the display layer 3. In an embodiment, the light emitting element 5 is an organic light emitting diode. In another embodiment, the light emitting element 5 is an inorganic light emitting diode.

Still referring to FIG. 29, the light emitting element 5 includes a plurality of first light emitting elements 51 disposed in the first display region 510, a plurality of second light emitting elements 52 disposed in the second display region 520, and a plurality of third light emitting elements 53 disposed in the third display region 530. The array layer 2 includes a plurality of pixel circuits, the pixel circuits include a polysilicon semiconductor or oxide semiconductor disposed on an active metal layer, a gate disposed on a gate metal layer, a capacitor electrode block disposed on a capacitor metal layer, a source electrode and a drain electrode disposed on a source and drain metal layer. In the embodiment of the present disclosure, the pixel circuit may be a 2T1C circuit, a 7T1C circuit, a 7T2C circuit, and the like. In this disclosure, the 2T1C circuit refers to a pixel circuit including two thin film transistors (T) and one capacitor (C). Other 7T1C circuits, 7T2C circuits and so on can be deduced by analogy.

The multiple pixel circuits in the display panel include a first pixel circuit 21, a second pixel circuit 22, and a third pixel circuit 23. The first pixel circuit 21 is electrically connected to at least one first light emitting element 51, and the second pixel circuit 22 is electrically connected to at least one second light emitting element 52, and the third pixel circuit 23 is electrically connected to at least one third light emitting element 53. As shown in FIG. 29, the first pixel circuit 21 is electrically connected to a first light emitting element 51, the second pixel circuit 22 is electrically connected to a second light element element 52, and the third pixel circuit 23 is electrically connected to a third light emitting element 53.

Figure 30:
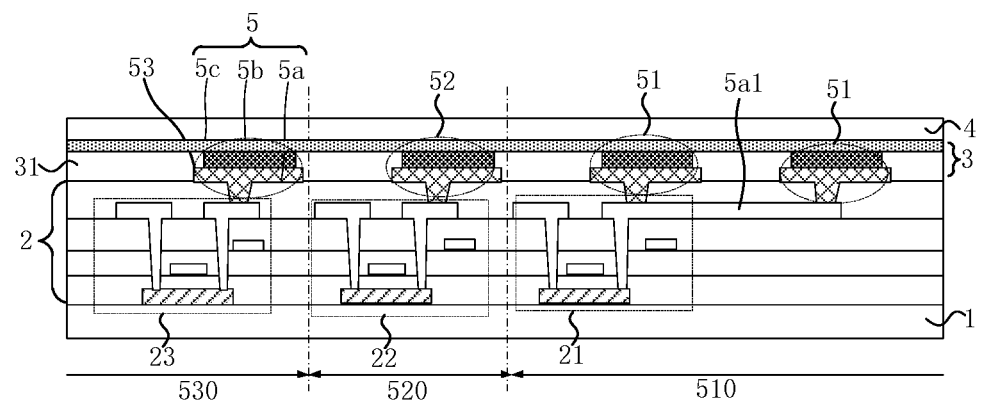
FIG. 30 is a cross-sectional view of another display panel according to an embodiment of the present disclosure.
Figure 31:
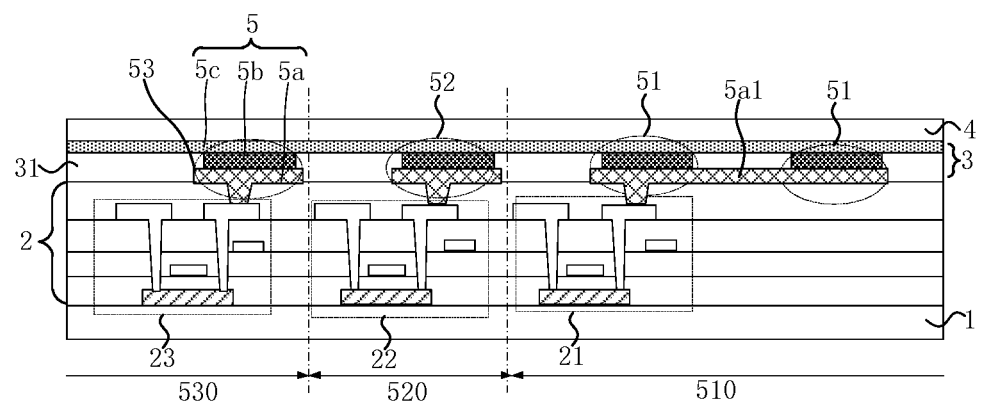
FIG. 31 is a cross-sectional view of another display panel according to an embodiment of the present disclosure.

In another embodiment of the present disclosure, the first pixel circuit 21 may be electrically connected to a plurality of first light emitting elements 51, the second pixel circuit 22 may be electrically connected to one or more second light emitting elements 52, and the third pixel circuit 23 may be electrically connected to one or more third light emitting elements. As shown in FIG. 30, FIG. 30 is a cross-sectional view of another display panel according to an embodiment of the present disclosure. The first pixel circuit 21 may be electrically connected to two first light emitting elements 51, the anodes of two first light emitting elements connected to the same first pixel circuit are electrically connected through a conductive trace Sal disposed on the source and drain metal layer. FIG. 31 is a cross-sectional view of another display panel according to an embodiment of the present disclosure, in the first display region 510, the anodes of the two first light emitting elements 51 electrically connected to the first pixel circuit 21 are electrically connected through the conductive trace Sal disposed on the anode layer. The embodiment of the present disclosure is not limited to the connection between the anodes of multiple light emitting elements of a pixel circuit, and at the same time, the conductive trace connecting the anodes does not limit the material which includes the metal trace or the transparent indium tin oxide.

In the embodiment of the present disclosure, one part of the first light emitting elements in the first display region may use a connection manner in which one first light emitting element is electrically connected to a first pixel circuit, and another part of the first light emitting elements may use a connection manner in which two first light emitting elements are electrically connected to a same first pixel circuit; or all of first light emitting elements in the first display region are connected in a connection manner in which two or more first light emitting elements are electrically connected to the same first pixel circuit. The second display region and the third display region can also use the above-mentioned connection manners.

The above-mentioned electrical connection may be achieved through the conductive traces, through thin film transistors, through vias or couplings, or through direct connections. The embodiments of the present disclosure are not limited to any one connection manner.

Figure 32:
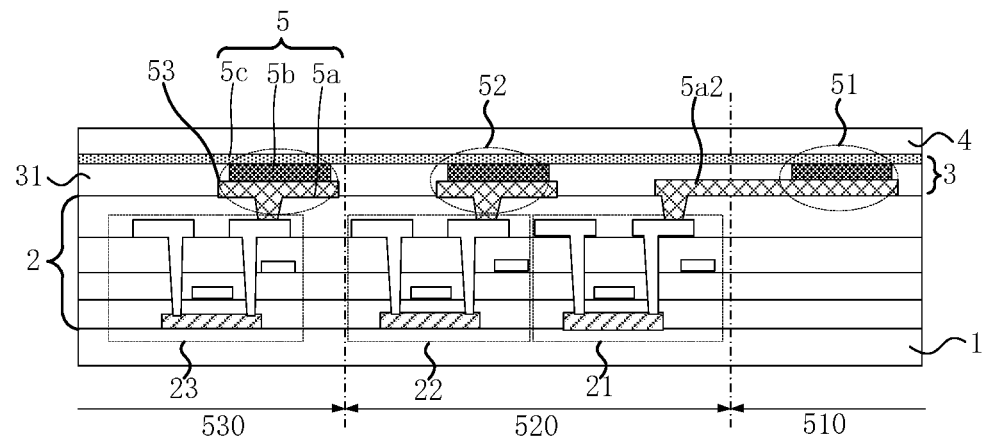
FIG. 32 is a cross-sectional view of another display panel according to an embodiment of the present disclosure.
Figure 33:
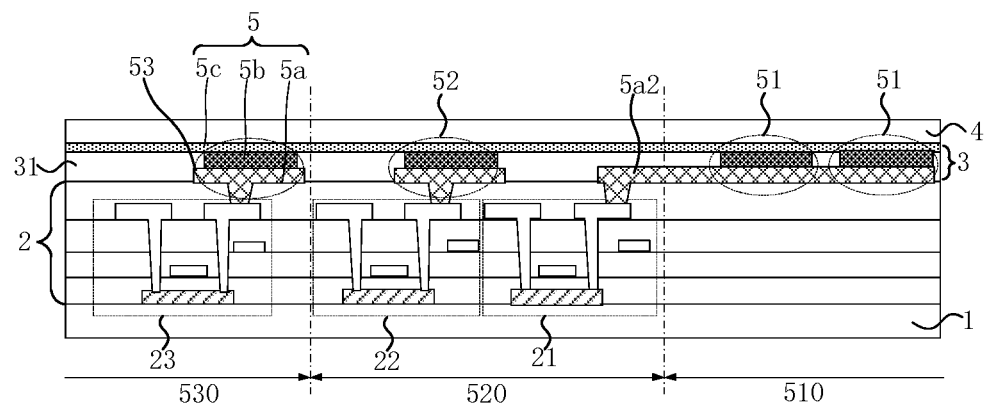
FIG. 33 is a cross-sectional view of another display panel according to an embodiment of the present disclosure.

As shown in FIG. 29 to FIG. 31, the first pixel circuit 21 connected to the first light emitting element 51 is disposed in the first display region 510. In another embodiment, at least one first pixel circuit is disposed in the second display region. As show in FIG. 32, FIG. 32 is a cross-sectional view of another display panel according to an embodiment of the present disclosure. In the first display region 510, a first pixel circuit 21 electrically connected to a first light emitting element 51 is disposed in the second display region, the anode of the first light emitting element is electrically connected to the first pixel circuit through an anode trace 5a2, where the anode trace 5a2 is disposed in a same metal layer as the anode; or as shown in FIG. 33, FIG. 33 is a cross-sectional view of another display panel according to an embodiment of the present disclosure, where in the first display region 510, the same first pixel circuit 21 electrically connected to two first light emitting elements 51 is disposed in the second display region, and the first light emitting element is electrically connected to the first pixel circuit through the anode trace 5a2. In other embodiments of the present disclosure, the anode trace may also be disposed in a same metal layer as the source or drain. The material of the anode trace is not limited to the metal trace, but also includes the transparent trace, such as indium tin oxide.

In the embodiment of the present disclosure, when at least one first pixel circuit is disposed in the second display region, a second pixel circuit may also be used in the second display region to electrically connect two or more second light emitting elements, thereby ensuring that the first pixel circuit can be accommodated in the second display region; or, the second pixel circuit connected to the second light emitting element can be disposed in the third display region, so that more space can be generated in the second display region to accommodate the second pixel circuits. In another embodiment, the arrangement density of the second light emitting elements in the second display region is reduced, so that regardless of whether the second pixel circuit is electrically connected to a second light emitting element or electrically connected to multiple second light emitting elements, it can ensure that more space is generated in the second display region to accommodate the first pixel circuits; or, the structure of the second pixel circuit is simplified, thereby reducing the occupied space of the second pixel circuit.

Still referring to FIG. 29 to FIG. 33, the first light emitting element 51 includes a first anode 511, and the third light emitting element 53 includes a third anode 531, In a case where a first light emitting element and a third light emitting element emit a same color, an area of the first anode 511 of the first light emitting element is smaller than an area of the third anode 513 of the third light emitting element. In the embodiment of the present disclosure, the light emitting element 5 includes a red light emitting element that emits red light, a green light emitting element that emits green light, and a blue light emitting element that emits blue light. The above-mentioned red emitting element, green emitting element, and blue light emitting element may be mixed to emit white light. The embodiment of the present disclosure is not limited to the above-mentioned light emitting color, as long as it can be mixed to emit white light. For example, the area of the first anode of the blue light emitting element in the first display region is smaller than the area of the third anode of the blue light emitting element in the third display region. Since the blue light emitting element has the lowest light-emitting luminance, when the area of the first anode of the blue light emitting element is reduced, the luminance of the first display region will not be excessively reduced. By reducing the area of the first anode in the first display region, the transmittance of the first display region can be increased.

Figure 34:
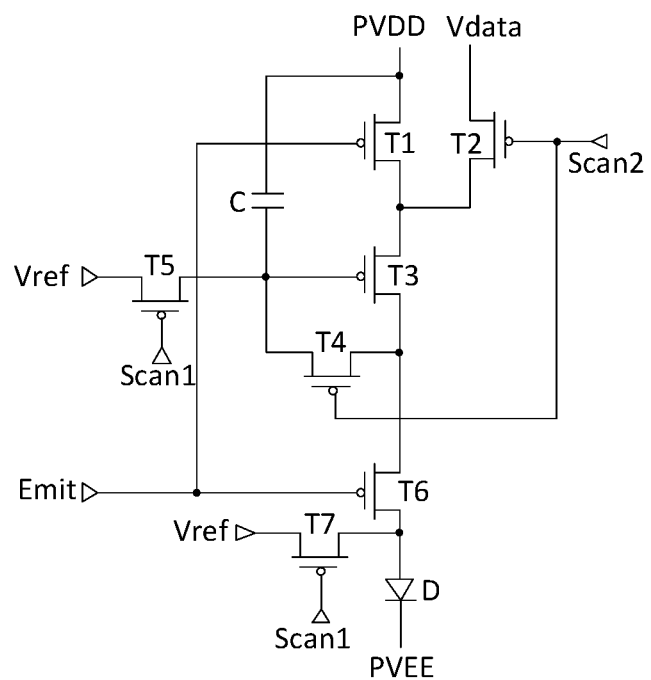
FIG. 34 is a schematic diagram of a first pixel circuit according to an embodiment of the present disclosure.
Figure 35:
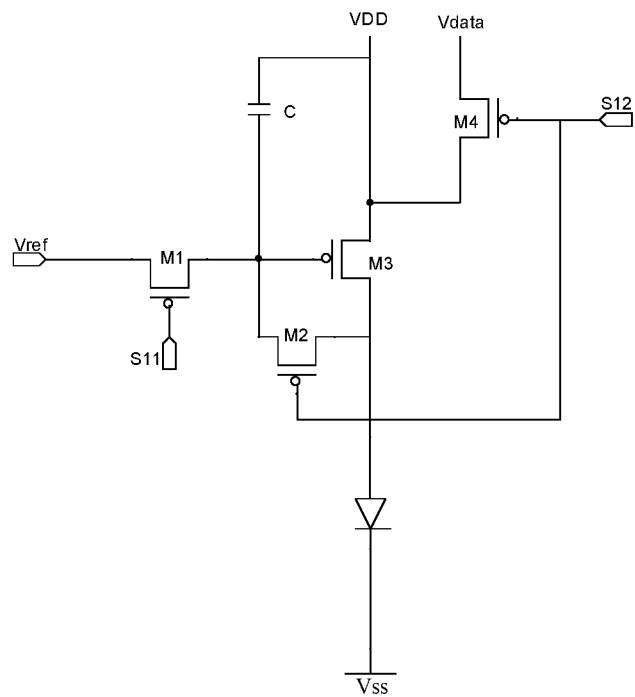
FIG. 35 is a schematic diagram of a third pixel circuit according to an embodiment of the present disclosure.
Figure 36:
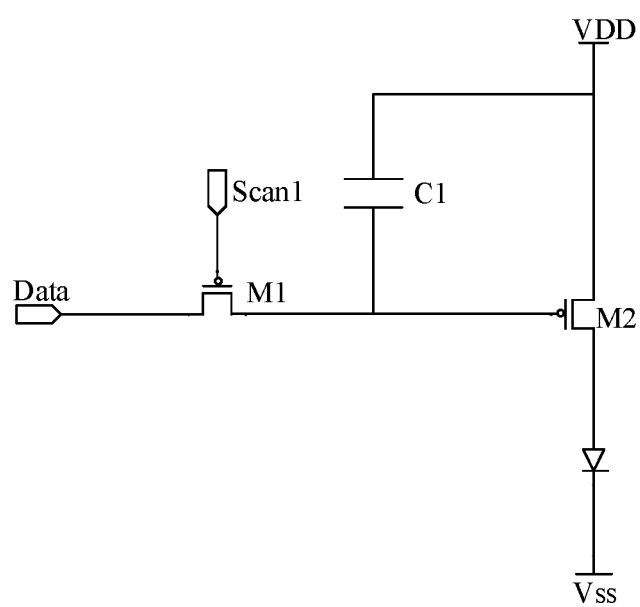
FIG. 36 is a schematic diagram of another third pixel circuit according to an embodiment of the present disclosure.

In another embodiment, the first pixel circuit includes a first number of transistors, the third pixel circuit includes a third number of transistors, and the first number is less than the third number. FIG. 34 is a schematic diagram of a first pixel circuit according to an embodiment of the present disclosure, FIG. 35 is a schematic diagram of a third pixel circuit according to an embodiment of the present disclosure, and FIG. 36 is a schematic diagram of another third pixel circuit according to an embodiment of the present disclosure. The structures of the first pixel circuit are shown in FIG. 34, where the first pixel circuit includes 7T1C, that is, 7 transistors and 1 capacitor, and the first number is 7. The structure of the third pixel circuit is shown in FIG. 35, where the third pixel circuit includes 4 transistors, and the third number is 4, or the structure of the third pixel circuit is shown in FIG. 36, the third pixel circuit includes 2 transistors, and the third number is 2. The embodiment of the present disclosure reduces the number of transistors of the first pixel circuit in the first display region, thereby increasing the light transmittance of the first display region.

Figure 37:
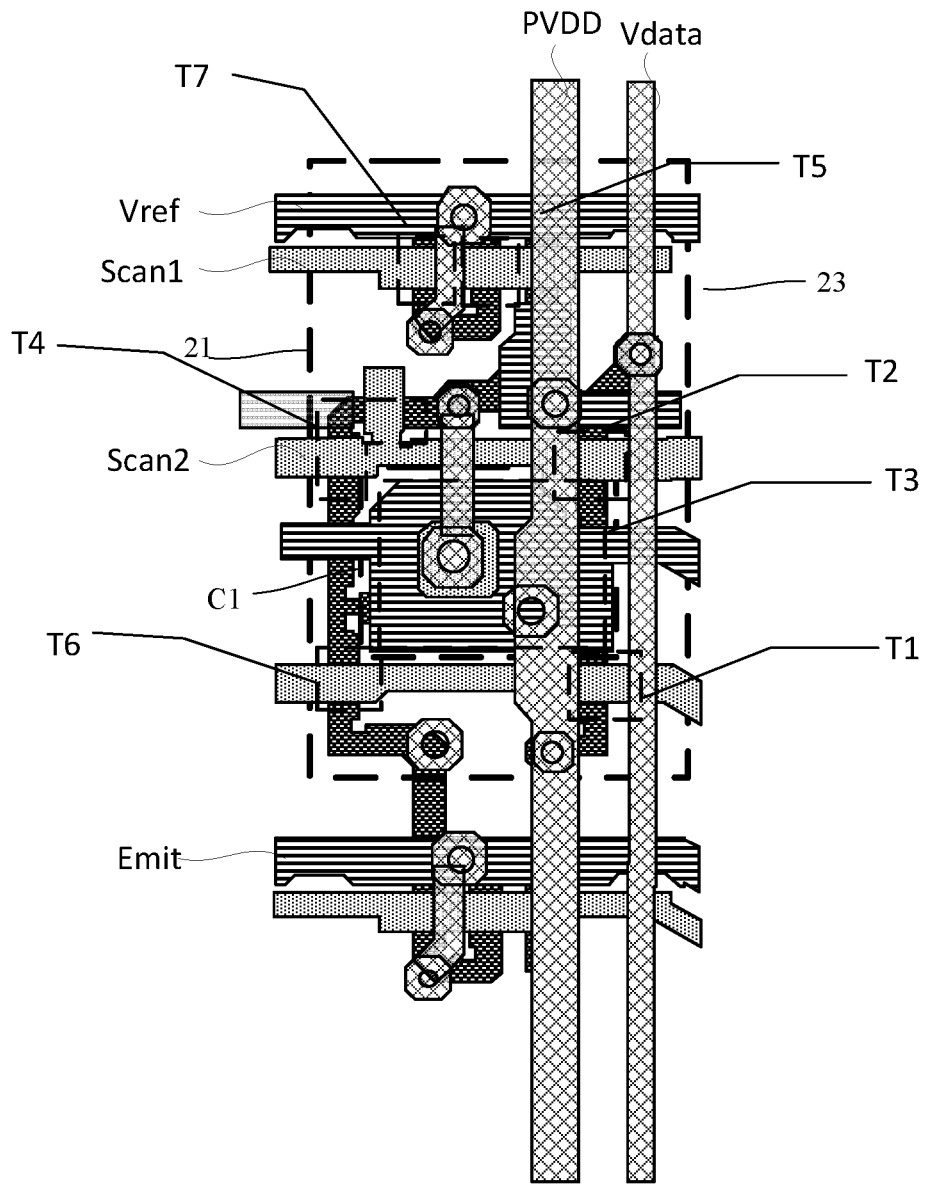
FIG. 37 is a schematic diagram of a layout of a first pixel circuit according to an embodiment of the present disclosure.
Figure 38:
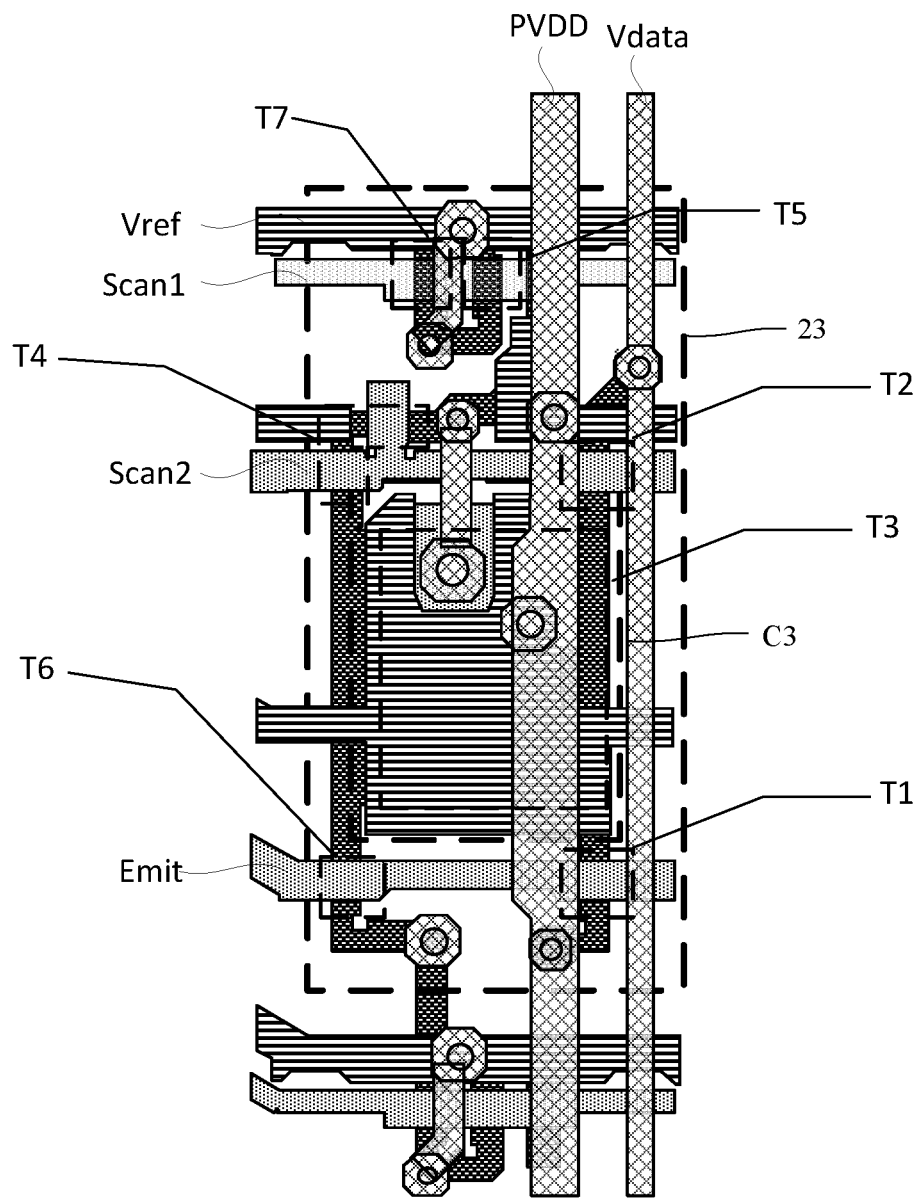
FIG. 38 is a schematic diagram of a layout of a third pixel circuit according to an embodiment of the present disclosure.

In another embodiment of the present invention, along the direction perpendicular to the plane where the display panel is located, the projection area of the first pixel circuit 21 is smaller than the projection area of the third pixel circuit 23. FIG. 37 is a diagram showing a layout of a first pixel circuit according to an embodiment of the present disclosure, and FIG. 38 is a diagram showing a layout of a third pixel circuit according to an embodiment of the present disclosure. As shown in FIG. 37 and FIG. 38, an area of a front projection of the capacitor C1 in the first pixel circuit 21 on the display panel is smaller than the area of a front projection of the capacitor C3 in the third pixel circuit 23 on the display panel, which may ensure that the front projection area of the first pixel circuit 21 on the display panel is smaller than the front projection area of the third pixel circuit 23 on the display panel, thereby increasing the transmittance of the first display region.

Additionally, still referring to FIG. 37 and FIG. 38, the first pixel circuit 21 includes a first driving transistor T1, and the third pixel circuit 23 includes a third driving transistor T3. The ratio of the width to length of the channel in the first driving transistor T1 is smaller than the ratio of the width to length of the channel in the third driving transistor T3, thereby reducing the area occupied by the first pixel circuit.

It should be noted that the second pixel circuit in the second display region includes the cases shown in FIG. 34 to FIG. 36, and also includes the layout in FIG. 37 and FIG. 38. The embodiment of the present disclosure is not limited to any one of the foregoing structures.

In the embodiment of the present disclosure, the display panel 50 is used to display a picture to be displayed.

In an embodiment of the present disclosure, the step of acquiring the picture to be displayed includes acquiring a first to-be-displayed picture having a first grayscale, where the first gray scale is a higher gray scale, and the first to-be-displayed picture is a to-be-displayed picture having a higher gray scale. Luminance J1 of the first display region per unit area, luminance J2 of the second display region per unit area, and luminance J3 of the third display region per unit area satisfy that J1<J2<J3.

In another embodiment of the present disclosure, the step of acquiring the picture to be displayed includes acquiring a second to-be-displayed picture having a second grayscale, where the second gray scale is a lower gray scale, and the second to-be-displayed picture is a to-be-displayed picture having a lower gray scale. Luminance J1 of the first display region per unit area, luminance J2 of the second display region per unit area, and luminance J3 of the third display region per unit area satisfy that J1>J2>J3.

It can be understood that the first gray scale is greater than the second gray scale, the first gray scale is suitable for the display panel to be operated in a normal display state, and the second gray scale is suitable for the display panel to be operated in the standby state or the screen off state. In the embodiment of the present disclosure, the luminance per unit area of the second display region is set between the first display region and the third display region to form a transitional luminance state, thereby ensuring that there is no obvious luminance dividing line between the first display region and the third display region and improving the display effect.

The display panel 50 is used for displaying a picture to be displayed.

Exemplarily, the display panel 50 may be a liquid crystal display panel, an organic light emitting diode display panel or other types of display panels known to those skilled in the art, which is not limited in the embodiments of the present disclosure.

Herein, the first display region 510 may also be referred to as a semi-transparent region 510, the second display region 520 may also be referred to as a transition region 520, and the third display region 530 may also be referred to as a normal display region 530. The transition region 520 is configured to implement the transition of a display effect between the semi-transparent region 510 and the normal display region 530.

The sub-pixel arrangement density of the first display region 510 is relatively small. Therefore, the first display region 510 has the higher transmittance, and a sensor module may be disposed in the first display region 510. Exemplarily, the sensor module may be a camera, an infrared detector, or other modules known to those skilled in the art. Therefore, while the display function can be implemented, photographing, infrared detection and other functions known to those skilled in the art can be integrated.

The sub-pixel arrangement density of the second display region 520 is equal to the sub-pixel arrangement density of the third display region 530, that is, in a practical product structure of the display panel 50, the second display region 520 and the third display region 530 may not be distinguished; and a difference between the second display region 520 and the third display region 530 is essentially embodied by different driving algorithms. Based on this, the technical solutions provided by the embodiments of the present disclosure may also be regarded as an improvement of a driving algorithm of the display panel on the basis of the existing display panel structure, to implement different display effects of the second display region 520 and the third display region 530 by using the different driving algorithms for the second display region 520 and the third display region 530, and thus implement the transition of the display effect between the first display region 510 and the third display region 530 by using the second display region 520, weaken a display boundary, and improve an overall display effect.

Exemplarily, referring to FIG. 4, the first display region 510 may be located on an edge of the display panel 50, the second display region 520 partially surrounds the first display region 510, and the third display region 530 surrounds the second display region 520.

Alternatively, referring to FIG. 5, the first display region 510 may be located inside the display panel 50, the second display region 520 surrounds the first display region 510, and the third display region 530 surrounds the second display region 520.

In other embodiments, the number of first display regions 510 and a position of the first display region 510 on a display surface of the display panel 50, shapes of the first display region 510, the second display region 520, and the third display region 530, and an overall shape of the display panel 50 may be set according to practical requirements of the display panel 10, which are not limited in the embodiments of the present disclosure.

Based on a structure of the display panel 50, referring to FIG. 3, the method for driving a display panel includes steps described below.

In S110, any one frame of picture to be displayed is acquired.

The picture to be displayed is a picture which needs to be displayed by the display panel. Exemplarily, the frame of the picture to be displayed may be a frame of the picture in a static image or may also be a frame of the picture in a dynamic scene image.

Exemplarily, if the display panel is applied to a mobile phone, the mobile phone may include a main board (including a driving system) and an integrated circuit (IC) connecting the main board and the display panel. Based on this, this step may include that the IC receives the picture to be displayed outputted by the main board.

Exemplarily, if the display panel is applied to a computer, the computer may include a display card and an IC connecting the display card and the display panel. Based on this, this step may include that the IC receives the picture to be displayed outputted by the display card.

In other embodiments, when the display panel is applied to another display device (or electronic device), this step may include that the IC acquires the picture to be displayed from an overall control system of the display device. Practical structure and form of the overall control system are not limited in the present disclosure.

In S120, the picture to be displayed is divided into a first partition picture, a second partition picture and a third partition picture.

Figure 7:
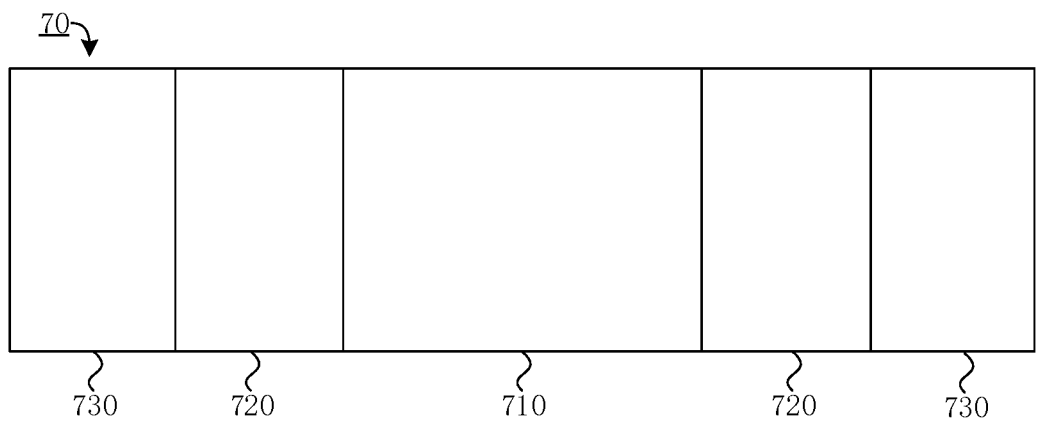
FIG. 7 is a schematic diagram of a partitioning manner of a display picture in a driving method according to an embodiment of the present disclosure.

Exemplarily, in conjunction with FIG. 6 and FIG. 7, corresponding to a partitioning design of the display panel 50 in FIG. 6, a picture 70 to be displayed may be divided into a first partition picture 710, a second partition picture 720 and a third partition picture 730.

Alternatively, this step may be understood as follows: the first partition picture 710 corresponding to the first display region 510 is determined according to the position of the first display region 510 of the display panel 50. Based on this, a partial picture next to the first partition picture 710 is determined as the second partition picture 720, and correspondingly, the second partition picture 720 is displayed by at least part of sub-pixels in the second display region 520. A picture to be displayed on a side of the second partition picture 720 facing away from the first partition picture 710 is the third partition picture 730, and the third partition picture 730 is displayed in the third display region 530.

Based on this, a shape and a position of the first partition picture 710 and the number of first partition pictures 710 depend on a shape and a position of the first display region 510 and the number of first display regions 510; a position and a size of the second display region 520 depend on a position and a size of the second partition picture 720; a manner for dividing the third display region 530 and the second display region 520 depends on a manner for dividing the third partition picture 730 and the second partition picture 720.

It should be noted that FIG. 6 and FIG. 7 merely exemplarily show that a boundary between the first display region 510 and the second display region 520, and a boundary between the second display region 520 and the third display region 530 are rectilinear boundaries, and correspondingly, a boundary between the first partition picture 710 and the second partition picture 720, and a boundary between the second partition picture 720 and the third partition picture 730 are rectilinear boundaries. In other embodiments, a line type of each boundary may be set according to practical requirements of the display panel and the method for driving the display panel. The line type may be a polyline, an arc or other line types known to those skilled in the art, which is not limited in the embodiments of the present disclosure.

In S130, the first partition picture is displayed in the first display region, the second partition picture is displayed in the second display region, and the third partition picture is displayed in the third display region.

In this way, different partition pictures are correspondingly displayed in different display regions.

Still referring to FIG. 6 and FIG. 7, in the same frame of picture 70 to be displayed, a density A1 of sub-pixels for displaying the first partition picture 710, a density A2 of sub-pixels for displaying the second partition picture 720 and a density A3 of sub-pixels for displaying the third partition picture 730 satisfy that $A1 \leq A2 \leq A3$; and sub-pixels 60 in the second display region 520 include first sub-pixels 610 and second sub-pixels 620, where display luminance L21 of the first sub-pixels 610 and display luminance L22 of the second sub-pixels 620 satisfy that $L21 > L22$.

It can be understood that, when the second partition picture is displayed, the sub-pixels in the second display region include two types of sub-pixels having different display luminance under the same gray scale, specifically, the first sub-pixel 610 having display luminance L21 and the second sub-pixel 620 having display luminance L22, where $L21 > L22$. The display luminance can be understood as the average luminance or the maximum luminance.

A sub-pixel density, the number of sub-pixels in a unit area, is a concept of an average value. In a practical product structure, the sub-pixels in the unit area may be uniformly arranged, or may be non-uniformly arranged according to practical requirements, which is not limited in the embodiments of the present disclosure.

Exemplarily, in the organic light emitting diode display panel, a sub-pixel may include a light emitting element; in the liquid crystal display panel, the sub-pixel may include a light-transmissive unit for modulating light in a liquid crystal cell and a corresponding color resist layer. In another type of display panel, the sub-pixel may be other components or units which emit light of a single color and are known to those skilled in the art, which is neither described nor limited in the embodiments of the present disclosure.

Herein, a partition picture may represent the first partition picture 710, the second partition picture 720 (including a second sub-partition picture 722 hereinafter) and the third partition picture 730, and a display partition may represent the first display region 510, the second display region 520 (including a second display sub-region 522 hereinafter) and the third display region 530, to describe a relationship between a density of sub-pixels in the display partition for displaying the partition picture and a display effect.

In the display partition, if the sub-pixels for displaying the partition picture have the greater density, a greater number of pixel points in the display picture are visible to human eyes in terms of a visual effect, and the display effect is finer; on the contrary, in the display partition, if the sub-pixels for displaying the partition picture have the smaller density, a smaller number of pixel points in the display picture are visible to human eyes in terms of the visual effect, and the display effect is worse, that is, the graininess is stronger.

It is to be understood that the pixel points form the display picture, and due to a relationship between a visual resolution of human eyes and sizes of the pixel points, the human eyes generally cannot directly observe each independent pixel point and can observe an overall display effect of a picture presented by all pixel points.

Based on this, in the embodiments of the present disclosure, a magnitude relationship of the densities of sub-pixels in the display regions for displaying the partition pictures is set, and specifically, it is set that $A1 < A2 < A3$, that is, the density A2 of the sub-pixels for displaying the second partition picture 720 is between the density A1 of the sub-pixels for displaying the first partition picture 710 and the density A3 of the sub-pixels for displaying the third partition picture 730, so that the number of pixel points in the second partition picture 720 is between the number of pixel points in the first partition picture 710 and the number of pixel points in the third partition picture 730. Thus, the transition of the number of pixel points between the first partition picture 710 and the third partition picture 730 can be implemented by using the second partition picture 720, that is, the transition from a rough picture of the first partition picture 710 to a fine picture of the third partition picture 730 can be implemented by using the second partition picture 720 with moderate roughness, thereby weakening the display boundary and improving the overall display effect of the display picture.

A case where A2=A3 is described below in conjunction with display luminance of the sub-pixel 60 in the second display region 520. Exemplarily, the sub-pixel 60 in the second display region 520 may be divided, according to the magnitude (which may also be referred to as strength) of the display luminance, into two types, namely, the first sub-pixel 610 and the second sub-pixel 620. The display luminance L21 of the first sub-pixel 610 is stronger, and the first sub-pixel 610 may be referred to as a strong display sub-pixel. The number of strong display sub-pixels determines the number of pixel points in the second partition picture 720. Exemplarily, the greater the number of strong display sub-pixels, the greater the number of pixel points in the second partition picture 720. The display luminance L22 of the second sub-pixel 620 is relatively weak, and the second sub-pixel 620 may be referred to as a weak display pixel. The weak display pixel may be used for compensating chromaticity of the display picture to reduce the color cast of the second partition picture 720 displayed by the second display region 520.

The display luminance of the weak display pixel is extremely low.

Exemplarily, in an example in which the display luminance of the sub-pixel 60 is represented by a display grayscale and the display grayscale ranges from 0 to 255, the display luminance is weakest at a grayscale of 0 and is strongest at a grayscale of 255, and within the range from 0 to 255, the greater a value of the grayscale, the higher the display luminance.

Based on this, if the display grayscale of the first sub-pixel 610 is 200 to 255, the display grayscale of the second sub-pixel 620 may be a maximum of 15; if the display grayscale of the first sub-pixel 610 is 50 to 80, the display grayscale of the second sub-pixel 620 may be a maximum of 5; if the display grayscale of the first sub-pixel 610 is 10 to 20, the display gray scale of the second sub-pixel 620 is a maximum of 1.

In other embodiments, the display luminance L21 of the first sub-pixel 610 and the display luminance L22 of the second sub-pixel 620 may also be determined in other manners known to those skilled in the art, or may also be characterized by other indicators known to those skilled in the art, which are neither described nor limited in the embodiments of the present disclosure.

It should be noted that in FIG. 6, the sub-pixel 60 whose contour line is a solid line represents the first sub-pixel 610 in the second display region 520, and the sub-pixel 60 whose contour line is a dotted line represents the second sub-pixel 620 in the second display region 520.

Figure 3:
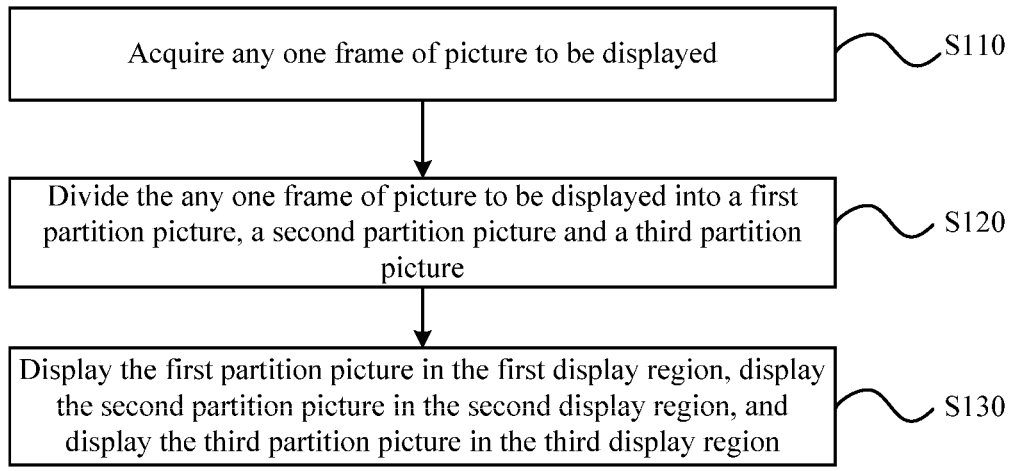
FIG. 3 is a flowchart of a driving method according to an embodiment of the present disclosure.

In addition, it should be noted that FIG. 6 merely exemplarily shows that a shape of the sub-pixel in the display panel 50 is a quadrangle, and filling patterns are used for distinguishing between sub-pixels and sub-pixels with three different light emitting colors are shown in FIG. 3, which are not to limit the display panel and the driving method thereof provided by the embodiments of the present disclosure. In other embodiments, the shape, arrangement manner and light emitting colors of the sub-pixels and the number of sub-pixels may be set according to the practical requirements of the display panel 50, which are not limited in the embodiments of the present disclosure.

Furthermore, it should be noted that when the sub-pixels in the display panel 50 emit light of two or more colors, the comparison of the display luminance of the sub-pixels may be understood as the comparison of the display luminance of sub-pixels with a same light emitting color, or may be understood as the comparison of the display luminance of pixel units each of which is formed by sub-pixels with different light emitting colors.

Finally, it should be noted that the number of first sub-pixels 610 may be the same or different from the number of second sub-pixels 620 in the second display region 520. When the two numbers are different, the number of first sub-pixels 610 may be larger, or the number of second sub-pixels 620 may be larger, which are not limited in the embodiments of the present disclosure.

On the basis of the display panel and the driving method thereof shown in FIG. 3, FIG. 6 and FIG. 7, in order to achieve a smoother picture transition effect of the second partition picture 720 and to perfectly "trick" the human eye, the second partition picture 720 may be further subdivided into two or more second sub-partition pictures; correspondingly, the second display region 520 needs to be divided into two or more second display sub-regions.

Figure 8:
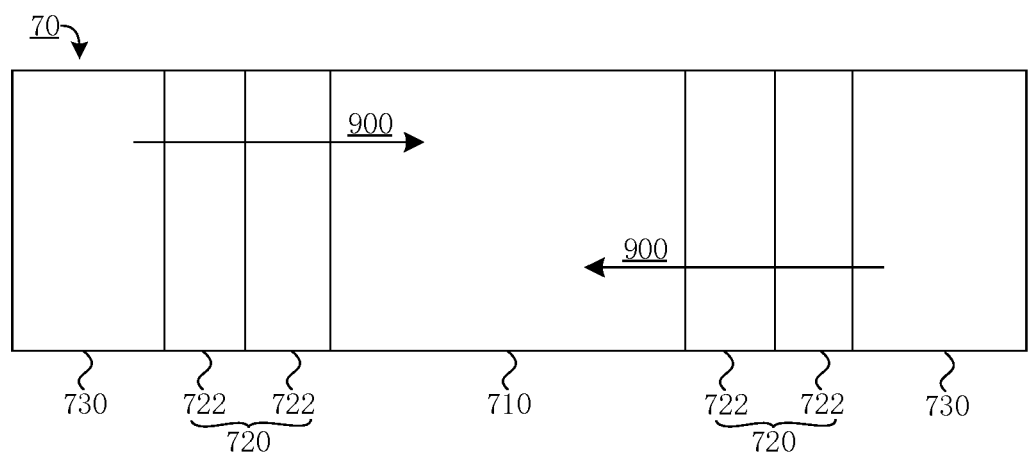
FIG. 8 is a schematic diagram of another partitioning manner of a display picture in a driving method according to an embodiment of the present disclosure.
Figure 9:
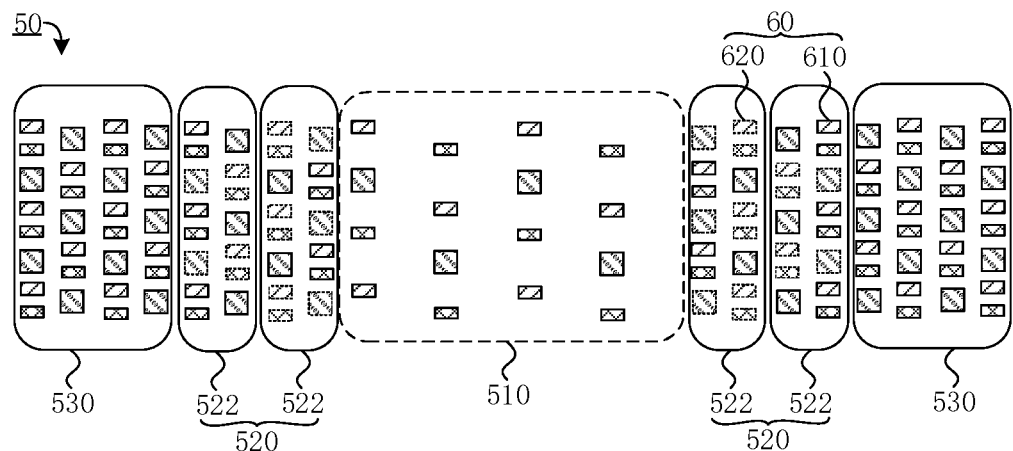
FIG. 9 is a schematic diagram of another partitioning manner of a display panel according to an embodiment of the present disclosure.

Optionally, referring to FIG. 8 and FIG. 9, the second partition picture 720 includes N (exemplarily, N=2 in FIG. 8) second sub-partition pictures 722, where the N second sub-partition pictures 722 are sequentially arranged along a preset direction 900 between the first partition picture 710 and the third partition picture 730, where the preset direction 900 is a direction of the second partition picture 720 away from the third partition picture 730; and correspondingly, the second display region 520 includes N (exemplarily, N=2 in FIG. 9) second display sub-regions 522, where the N second display sub-regions 522 are in a one-to-one correspondence with the N second sub-partition pictures 722, where N is a positive integer greater than 1. Densities of the first sub-pixels 610 corresponding to the N second sub-partition pictures 722 are reduced along the preset direction 900 between the first partition picture 710 and the third partition picture 730. In the same frame of picture 70 to be displayed, along the preset direction 900, a density of the first sub-pixels 610 for displaying a first one of the N second sub-partition pictures 722 is less than the density of the sub-pixels for displaying the third partition picture 730, and a density of the first sub-pixels 610 for displaying an N-th one of the N second sub-partition pictures 722 is greater than the density of the sub-pixels for displaying the first partition picture 710.

In this way, the second partition picture 720 may be subdivided into the N second sub-partition pictures 722 along the preset direction 900, and each second sub-partition picture 722 may implement the transition of a display effect between two partition pictures adjacent to the each second sub-partition picture 722, so as to form multiple transition levels of the display effect. This configuration is equivalent to dividing the transition region of the display effect with a large span between the third partition picture 730 and the first partition picture 710 into N transition sub-regions of the display effect with a smaller span, thereby achieving the smoother transition and the better overall display effect of the display picture of the display panel.

Correspondingly, the second display region 520 may be divided into the N second display sub-regions 522, and each second display sub-region 522 may correspondingly display one second sub-partition picture 722. It is set that the density of the first sub-pixels 610 for displaying the first one of the N second sub-partition pictures 722 is less than the density of the sub-pixels for displaying the third partition picture 730, the density of the first sub-pixels 610 for displaying the N-th one of the N second sub-partition pictures 722 is greater than the density of the sub-pixels for displaying the first partition picture 710, and the densities of the first sub-pixels 610 corresponding to the N second sub-partition pictures 722 are reduced along the preset direction 900 between the first partition picture 710 and the third partition picture 730, so that the numbers of pixel points in the N second sub-partition pictures 722 each may be between the number of pixel points in the first partition picture 710 and the number of pixel points in the third partition picture 730, and are sequentially reduced along the preset direction 900 between the first partition picture 710 and the third partition picture 730. Therefore, from the third partition picture 730 through the N second sub-partition pictures 722 to the first partition picture 710, the fineness of the display picture is gradually reduced according to a small change gradient, or it is understood as a gradual increase of the graininess of the display picture according to a small change gradient, thereby achieving the smoother transition.

Exemplarily, FIG. 8 shows that the second partition picture 720 includes two second sub-partition pictures, and FIG. 9 shows that the second display region 520 includes two second display sub-regions 522. Along the preset direction 900, densities of the sub-pixels in the display regions for displaying the partition pictures are sequential in a descending order, the density of the sub-pixels in the third display region 530 for displaying the third partition picture 730, the density of the first sub-pixels 610 for displaying a first one of the two second sub-partition pictures 722, the density of the first sub-pixels 610 for displaying a second one of the two second sub-partition pictures 722, and the density of the sub-pixels in the first display region 510 for displaying the first partition picture 710.

In other embodiments, the second partition picture 720 may further include three or more second sub-partition pictures 722, which may be configured under the balanced consideration of the transition effect and difficulty levels of the driving algorithms according to the practical requirements of the display panel and the driving method thereof, and it is not limited in the embodiments of the present disclosure.

It should be noted that FIG. 9 merely exemplarily shows that the second display sub-regions 522 are adjacent to and independent from each other, and a boundary between two adjacent second display sub-regions 522 is a straight line. In other embodiments, the second display sub-regions 522 may overlap with each other, and a boundary contour line of the second display sub-region 522 may also be a polyline, an arc or other types of line known to those skilled in the art, which is not limited in the embodiments of the present disclosure.

Figure 10:
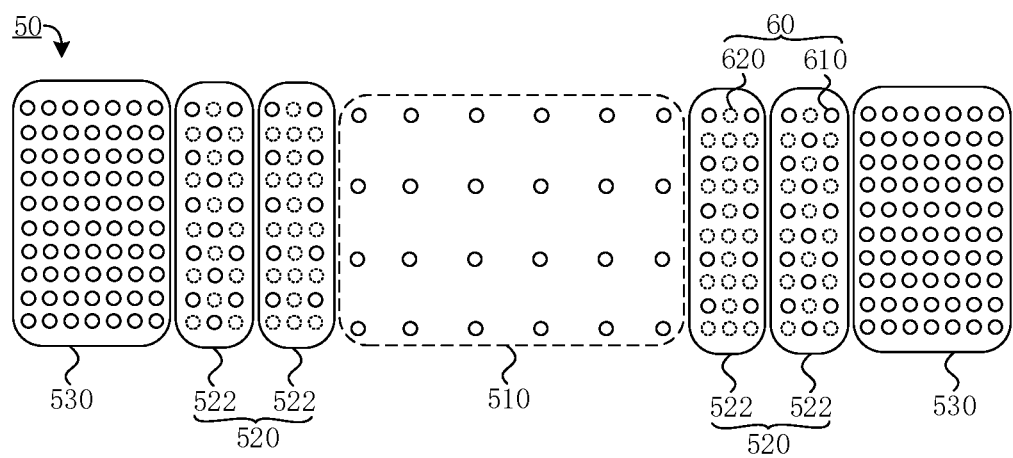
FIG. 10 is a schematic diagram of another partitioning manner of a display panel according to an embodiment of the present disclosure.

Optionally, referring to FIG. 8 and FIG. 10, the first sub-pixels 610 for displaying each second sub-partition picture 722 are uniformly distributed in a respective one of the second display sub-regions 522.

The uniform distribution means that a distance between two adjacent sub-pixels in a same rank is equal. A direction of the "rank" may refer to a row direction or a column direction of a pixel array or any one direction on a plane where the pixel array is located, which is not limited in the embodiments of the present disclosure.

The uniform distribution of the first sub-pixels 610 in each second display sub-region 522 is configured, which facilitates the uniform distribution of pixel points in the second sub-partition picture 722 corresponding to the each second display sub-region 522, and thereby is beneficial for ensuring that each second sub-partition picture 722 has a better picture display effect and the display picture of the display panel has the better overall display effect.

It should be noted that in FIG. 10, a circle merely exemplarily represents the position of each sub-pixel, which is not to limit a practical shape of the sub-pixel.

Optionally, referring to FIG. 8 and FIG. 10, when N≥3, the densities of the first sub-pixels 610 corresponding to the N second sub-partition pictures 722 are in an arithmetic progression along the preset direction 900 between the first partition picture 710 and the third partition picture 730.

In this way, the numbers of pixel points in the N second sub-partition pictures 722 may be in an arithmetic progression, so that a change gradient of the display effect between adjacent second sub-partition pictures 722 remains the same, thereby achieving the smoother transition and facilitating the improvement of the overall display effect.

Exemplarily, when N≥2, it may be further set that along the preset direction 900, a difference between the density of the sub-pixels for displaying the first partition picture 710 and the density of the first sub-pixels 610 for displaying the N-th one of the N second sub-partition pictures 722, a difference between the density of the sub-pixels for displaying the third partition picture 730 and the density of the first sub-pixels 610 for displaying the first one of the N second sub-partition pictures 722, and a difference between densities of the first sub-pixels 610 for displaying two adjacent second sub-partition pictures 722 are equal. Therefore, the transition of the display effect between all partition pictures is consistent, thereby achieving the smoother transition and facilitating the improvement of the overall display effect of the display picture.

In other embodiments, similarly, when N=1, it may be further set that a difference between the density of the sub-pixels for displaying the first partition picture 710 and a density of the first sub-pixels 610 for displaying the second partition picture 720 is equal to a difference between the density of the sub-pixels for displaying the third partition picture 730 and the density of the first sub-pixels 610 for displaying the second partition picture 720. Therefore, the transition of the display effect between all the partition pictures is consistent, thereby achieving the smoother transition and facilitating the improvement of the overall display effect of the display picture.

Figure 11:
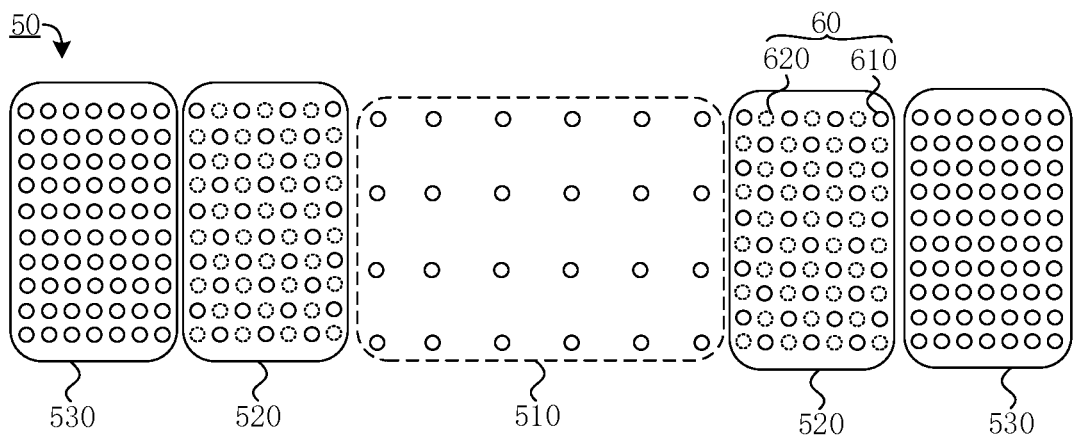
FIG. 11 is a schematic diagram of another partitioning manner of a display panel according to an embodiment of the present disclosure.

Optionally, referring to FIG. 7 and FIG. 11, the first sub-pixels 610 for displaying the second partition picture 720 are uniformly distributed in the second display region 520.

The "uniform distribution" has the same meaning as the "uniform distribution" described above and may be understood by referring to the above-mentioned description and is not repeated herein.

With such a configuration, the pixel points in the second partition picture 720 may be uniformly distributed, so that the second partition picture 720 has a better display effect, which is beneficial for ensuring the better overall display effect of the display picture.

It should be noted that when the sub-pixels include sub-pixels with two or more different light emitting colors, the "uniform distribution" limits an arrangement manner of the sub-pixels with the same light emitting color or is understood as a limitation of an arrangement manner of the pixel units each of which is formed by the sub-pixels with different light emitting colors.

In the above-mentioned embodiments, the second display region 520 has the same sub-pixel arrangement manner as the third display region 530 of the display panel 50. Due to different driving algorithms used by the second display region 520 and the third display region 530, sub-pixels in the second display region 520 for a practical display may have a different state from sub-pixels in the third display region 530 for the practical display.

Exemplarily, all the sub-pixels in the third display region 530 may be used for displaying the third partition picture, that is, the state of each sub-pixel in the third display region 530 is equivalent to the strong display sub-pixel in the second display region 520, and the weak display sub-pixel does not exist in the third display region 530; the density of the first sub-pixels 610 in the second display region 520 for displaying the second partition picture 720 may be less than the density of the sub-pixels in the third display region 530 for displaying the third partition picture 730, the second display region 520 further includes the second sub-pixels 620, and the display luminance L22 of the second sub-pixels 620 is less than the display luminance L21 of the first sub-pixels 610.

Optionally, the display luminance L22 of the second sub-pixel is equal to 0.

That is, the second sub-pixel does not emit light. In this way, a total number of sub-pixels in the second display region for displaying the second partition picture may be reduced, thereby facilitating the simplification of the driving algorithm.

It may be known to those skilled in the art that for the sub-pixels with a same structure (e.g., the same light emitting color in the display panel), the display luminance of the sub-pixels is positively correlated to a driving current of the sub-pixels and negatively correlated to a service life of the sub-pixels, that is, the higher the display luminance of a sub-pixel, the greater driving current the sub-pixel requires and the faster the service life of the sub-pixel decays.

Based on this, in the second display region 520, the first sub-pixel 610 decays faster than the second sub-pixel 620. During the continuous use of the display panel, it is set that positions of the first sub-pixels 610 and positions of the second sub-pixels 620 are variable for different frames of picture to be displayed, so that for the sub-pixel 60 at each position of the second display region 520, the continuous usage time in the case of the higher display luminance and the continuous usage time in the case of the lower display luminance may be balanced, and the continuous usage time in the case of the higher display luminance for the sub-pixel 60 at each position is less than the cumulative usage duration of the display panel, thereby facilitating the improvement of a service life of the second display region 520. Exemplary descriptions are provided below in conjunction with FIG. 12 to FIG. 17.

Optionally, referring to FIG. 7, FIG. 12, FIG. 13, and FIG. 14, the display panel 50 displays M frames of picture 70 to be displayed per second, where M is a positive integer greater than 1; at least two display modes are used per second, where at least one frame of picture 70 to be displayed is continuously displayed in each of the at least two display modes; the first sub-pixels 610 in the second display region 520 for displaying the second partition picture 720 of each frame of picture 70 to be displayed in a same display mode have the same positions; and the first sub-pixels 610 in the second display region 520 for displaying the second partition picture 720 of frames of picture 70 to be displayed in different display modes have at least partially different positions.

A value of M may be set according to display requirements of the display panel, a dynamic picture may have a higher frame refresh rate and correspond to a greater value of M, and a static picture may have a lower frame refresh rate and correspond to a smaller value of M.

Exemplarily, M may be 30, 60, 120 or other values known to those skilled in the art, which is not limited in the embodiments of the present disclosure.

Two adjacent frames of the picture to be displayed may be displayed in a same display mode or in different display modes, that is, one frame, two consecutive frames or multiple consecutive frames of the picture to be displayed may be displayed in the same display mode.

In different display modes, the sub-pixels 60 with at least partially different positions in the second display region 520 may be used as the first sub-pixels 610, that is, in different display modes, the sub-pixel 60 at a same position may be alternately used as the first sub-pixel 610 and the second sub-pixel 620, thereby improving the utilization rate of the sub-pixels in the second display region 520.

Figure 12:
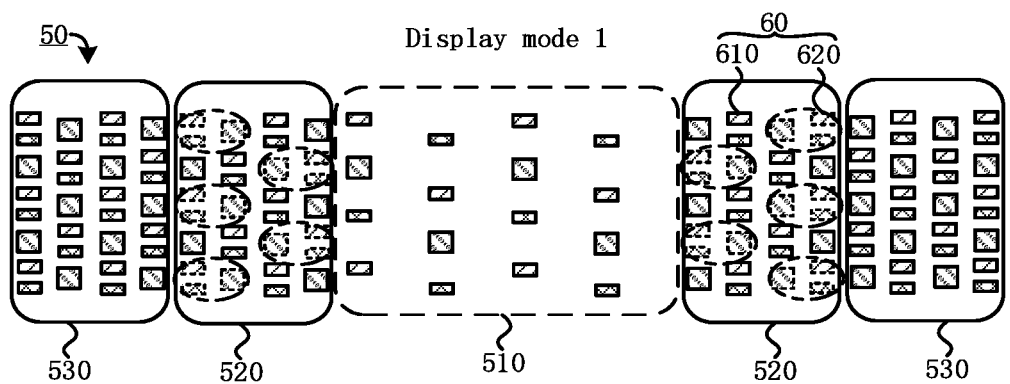
FIG. 12 is a contrast diagram of a display panel in different display modes according to an embodiment of the present disclosure.
Figure 12:
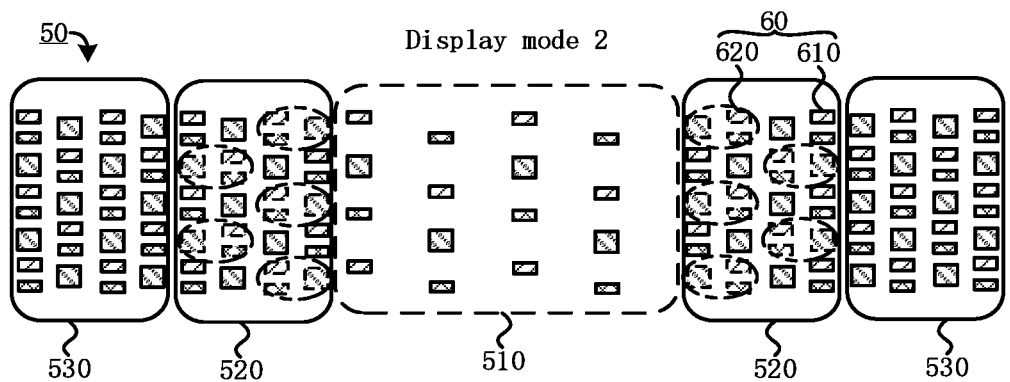
Figure 13:
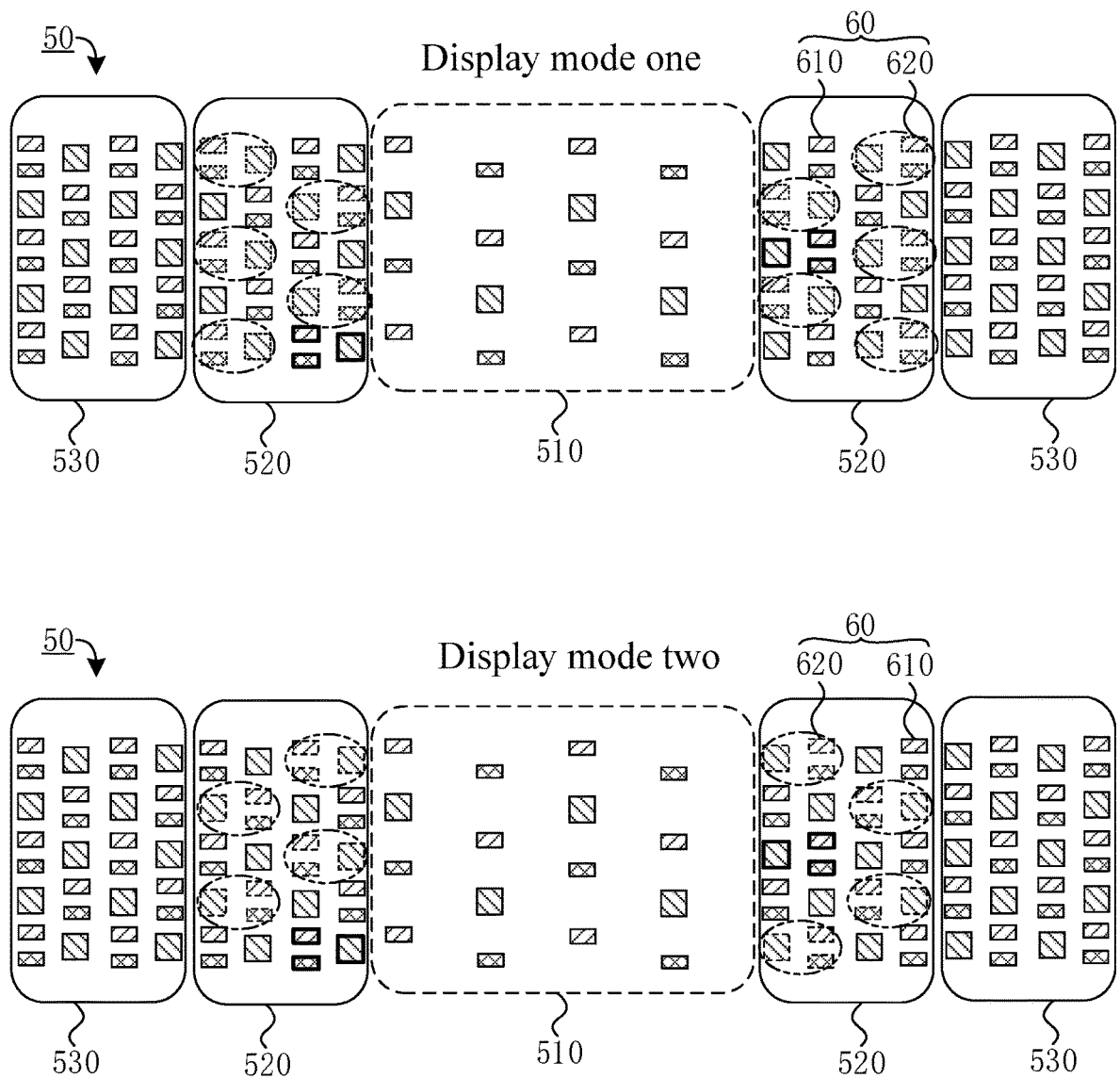
FIG. 13 is another contrast diagram of a display panel in different display modes according to an embodiment of the present disclosure.

Exemplarily, referring to FIG. 12 and FIG. 13, two display modes, display mode one and display mode two, are shown. In FIG. 12, the first sub-pixels 610 in display mode one have completely different positions from the first sub-pixels 610 in display mode two. In FIG. 13, positions of the first sub-pixels 610 in display mode one and positions of the first sub-pixels 610 in display mode two are partially the same (first sub-pixels 610 at same positions are shown by bold contour lines) and are partially different.

In other embodiments, it may be further set, according to the practical requirements of the display panel and the driving method thereof, that three or more display modes are used per second, where the first sub-pixels 610 in any two display modes have at least partially different positions (exemplarily, the first sub-pixels 610 in three display modes have different positions from one another), which is not limited in the embodiments of the present disclosure.

It is to be understood by those skilled in the art that as the number of display modes increases, the IC is more complicated in hardware, the driving algorithm is more complicated, and the driving method is implemented with a greater difficulty. Therefore, the number of display modes needs a balanced consideration according to a requirement on the service life of the display panel, a requirement on the utilization rate of the sub-pixels, an implementation difficulty and implementation costs, and needs to be set according to the practical requirements of the display panel and the driving method thereof, which is not limited in the embodiments of the present disclosure.

It should be noted that FIG. 13 merely exemplarily shows that 6 first sub-pixels 610 have same positions in display mode one and display mode two, and are all disposed in a region of the second display region 520 facing towards the first display region 510. In other implementations, the number of first sub-pixels 610 and the positions of the first sub-pixels 610 with the same positions in display mode one and display mode two may also be set according to the practical requirements of the display panel and the driving method thereof, which are not limited in the embodiments of the present disclosure.

Figure 14:
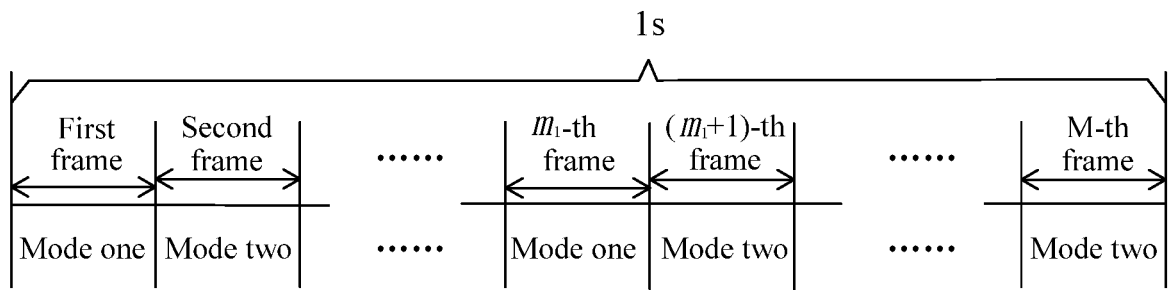
FIG. 14 is a schematic diagram of a driving mode in a driving method according to an embodiment of the present disclosure.

Optionally, in conjunction with FIG. 12 and FIG. 14, the at least two display modes include a first display mode (that is, display mode one, abbreviated as "mode one" in FIG. 14 to FIG. 16) and a second display mode (that is, display mode two, abbreviated as "mode two" in FIG. 14 to FIG. 16), where positions of the first sub-pixels 610 in the second display region 520 for displaying the picture to be displayed in the first display mode are different from positions of the first sub-pixels 610 in the second display region 520 for displaying the picture to be displayed in the second display mode, a part of the sub-pixels 60 in the second display region 520 are used as the first sub-pixels 610 in the first display mode, and remaining sub-pixels 60 (that is, second sub-pixels 620 in display mode one) in the second display region 520 except the part of the sub-pixels 60 used in the first display mode are used as the first sub-pixels 610 in the second display mode; and each of the first display mode and the second display mode displays one frame of picture to be displayed; and an $m_1$-th frame of picture to be displayed is displayed in the first display mode, and an $(m_1+1)$-th frame of picture to be displayed is displayed in the second display mode, where $1 \leq m_1 < m_1+1 \leq M$, and $m_1$ is an integer.

Two adjacent frames of the picture to be displayed are separately displayed in the first display mode and the second display mode, that is, in a display process of two adjacent frames of the picture to be displayed, the sub-pixels at same positions are alternately used as the first sub-pixels and the second sub-pixels. Meanwhile, because the positions of the first sub-pixels in the first display mode are completely different from the positions of the first sub-pixels in the second display mode, and all the sub-pixels in the second display region are used in the first display mode and the second display mode, so that the cumulative time of each sub-pixel used as the strong display sub-pixel is approximately half of the continuous usage time of the display panel, thereby prolonging the service life of the sub-pixel and the vail use time of the second display region.

Exemplarily, referring to FIG. 14, among the M frames of picture to be displayed in 1 s, a first frame, a third frame, . . . , the $m_1$-th frame, . . . , and an (M−1)-th frame of picture to be displayed may be displayed in the first display mode; a second frame, a fourth frame, . . . , the $(m_1+1)$-th frame, . . . , and an M-th frame of picture to be displayed may be displayed in the second display mode. In this case, $m_1$ is an odd number and M is an even number.

In other implementations, M may also be an odd number. In this case, there may be two manners for substituting the display modes. In one manner, the M-th frame in a current second is displayed in the first display mode and a first frame in a next second is displayed in the second display mode. In this way, in two adjacent seconds, an odd-numbered frame in the current second uses the first display mode and an even-numbered frame in the current uses the second display mode; or an odd-numbered frame in the current second uses the second display mode, and an even-numbered frame uses the first display mode. In a continuous working process of the display panel, the first display mode and the second display mode are alternately used for displaying two adjacent frames of picture to be displayed. In the other manner, in each second, the first display mode and the second display mode are alternately used for displaying each two adjacent frames of picture to be displayed, and the manner for substituting the display modes in the current second is the same as that in the next second. That is, in the continuous working process of the display panel, two adjacent frames of picture to be displayed are displayed in the same display mode.

In another embodiment, the positions of the first sub-pixels used in the two alternate display modes may also be partially the same, which may be embodied in conjunction with FIG. 13 and FIG. 14. The manner for substituting the display modes is similar to the above-mentioned manners and is not described herein again.

It should be noted that FIG. 14 merely exemplarily shows that the two display modes are alternately used for displaying two adjacent frames of picture to be displayed. In other implementations, one display mode may continuously display two or more frames of picture to be displayed, which is described below in conjunction with FIG. 15 and FIG. 16.

Figure 15:
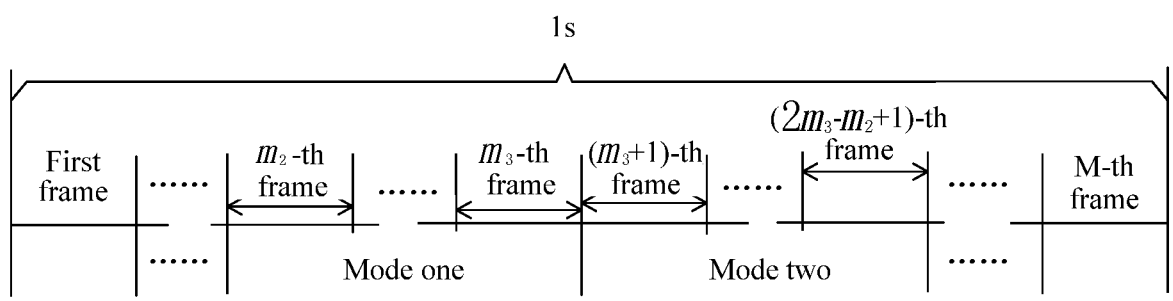
FIG. 15 is a schematic diagram of another driving mode in a driving method according to an embodiment of the present disclosure.

Optionally, in conjunction with FIG. 12 and FIG. 15, the at least two display modes includes the first display mode (that is, mode one) and the second display mode (that is, mode two), where the positions of the first sub-pixels 610 in the second display region 520 for displaying the picture to be displayed in the first display mode are different from the positions of the first sub-pixels 610 in the second display region 520 for displaying the picture to be displayed in the second display mode, a part of the sub-pixels 60 in the second display region 520 are used as the first sub-pixels 610 in the first display mode, and the remaining sub-pixels 60 (that is, the second sub-pixels in display mode one) in the second display region 520 except the part of the sub-pixels 60 used in the first display mode are used as the first sub-pixels 610 in the second display mode; and an $m_2$-th frame of picture to be displayed to an $m_3$-th frame of picture to be displayed are displayed in the first display mode, and an $(m_3+1)$-th frame of picture to be displayed to a $(2m_3-m_2+1)$-th frame of picture to be displayed are displayed in the second display mode; where $1 \leq m_2 < m_3 \leq M$, and $m_2$ and $m_3$ are integers.

The first display mode and the second display mode are alternated, and each display mode may display $(m_3-m_2+1)$ frames of picture to be displayed. In this way, the first display mode and the second display mode may be alternated fewer times, thereby facilitating the simplification of the driving algorithm and the reduction of power consumption Exemplarily, M may be 20, each five adjacent frames are displayed in a same display mode; when $m_2$ is 1, $m_3$ is 5; or when $m_2$ is 11, $m_3$ is 15. Therefore, a first frame to a fifth frame of picture to be displayed, and an eleventh frame to a fifteenth frame of picture to be displayed may be displayed in the first display mode; and a sixth frame to a tenth frame of picture to be displayed, and a sixteenth frame to a twentieth frame of picture to be displayed may be displayed in the second display mode.

It should be noted that FIG. 15 merely exemplarily shows that the first display mode and the second display mode are used for displaying the same number of frames of picture to be displayed during the first display mode and the second display mode are continuously used. In other embodiments, the first display mode and the second display mode may also be configured to display different numbers of frames of picture to be displayed according to the practical requirements of the display panel and the driving method thereof, which is not limited in the embodiments of the present disclosure.

In this embodiment, the first display mode and the second display mode may be alternated once, twice or more times within 1 s, which may be set according to the practical requirements of the display panel and the driving method thereof, and is not limited in the embodiments of the present disclosure.

Figure 16:
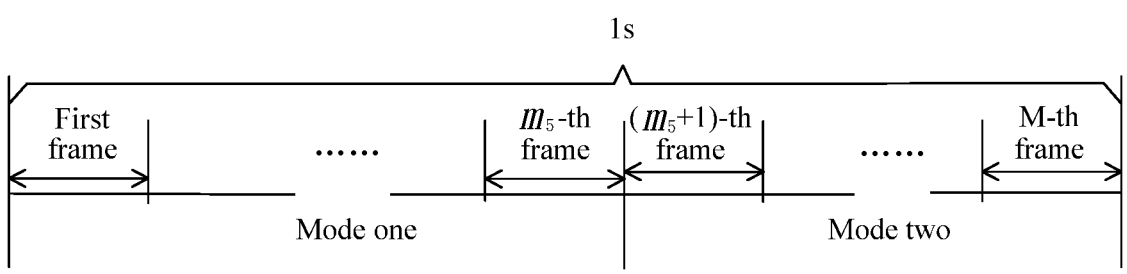
FIG. 16 is a schematic diagram of another driving mode in a driving method according to an embodiment of the present disclosure.
Figure 17:
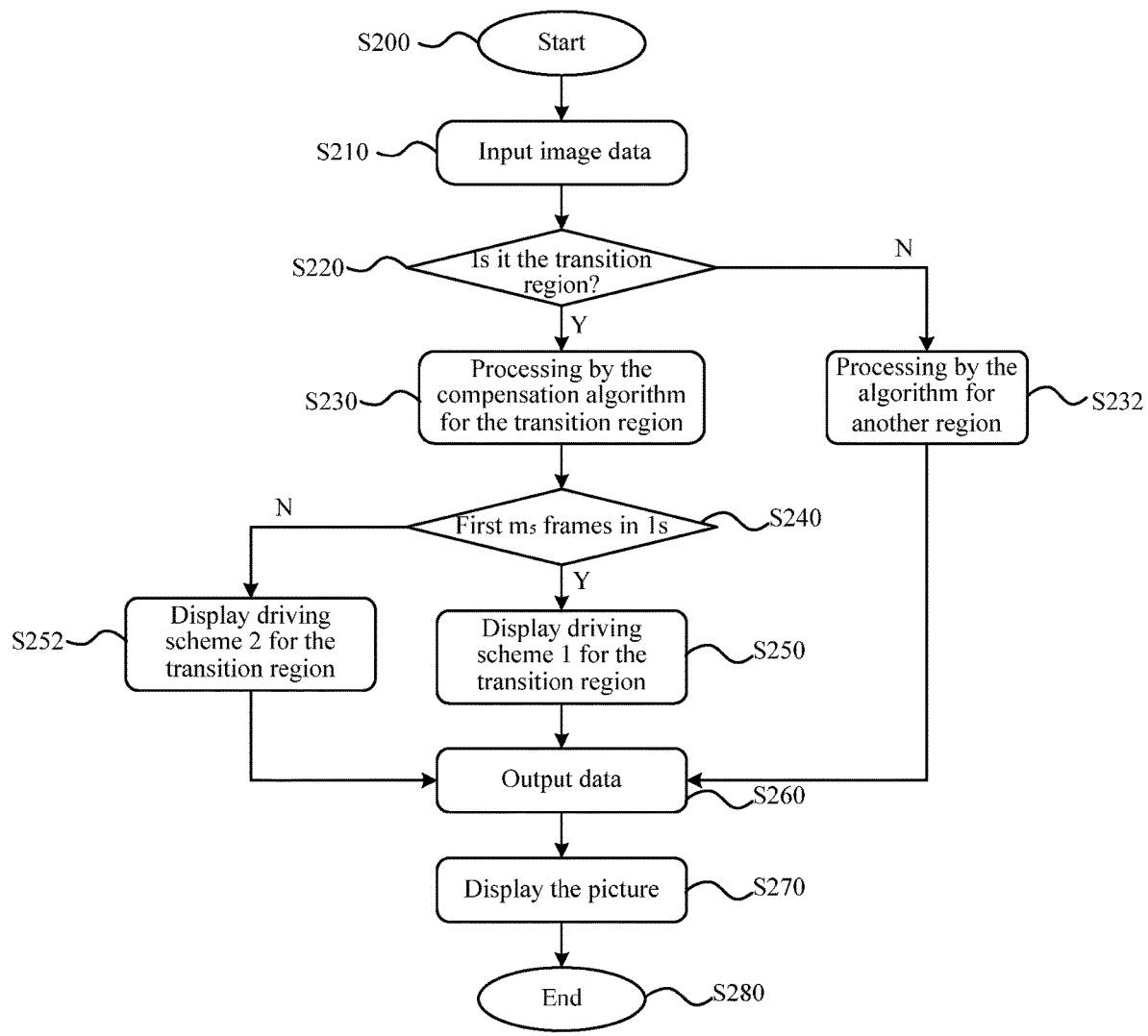
FIG. 17 is a flowchart of another driving method according to an embodiment of the present disclosure.
Figure 18:
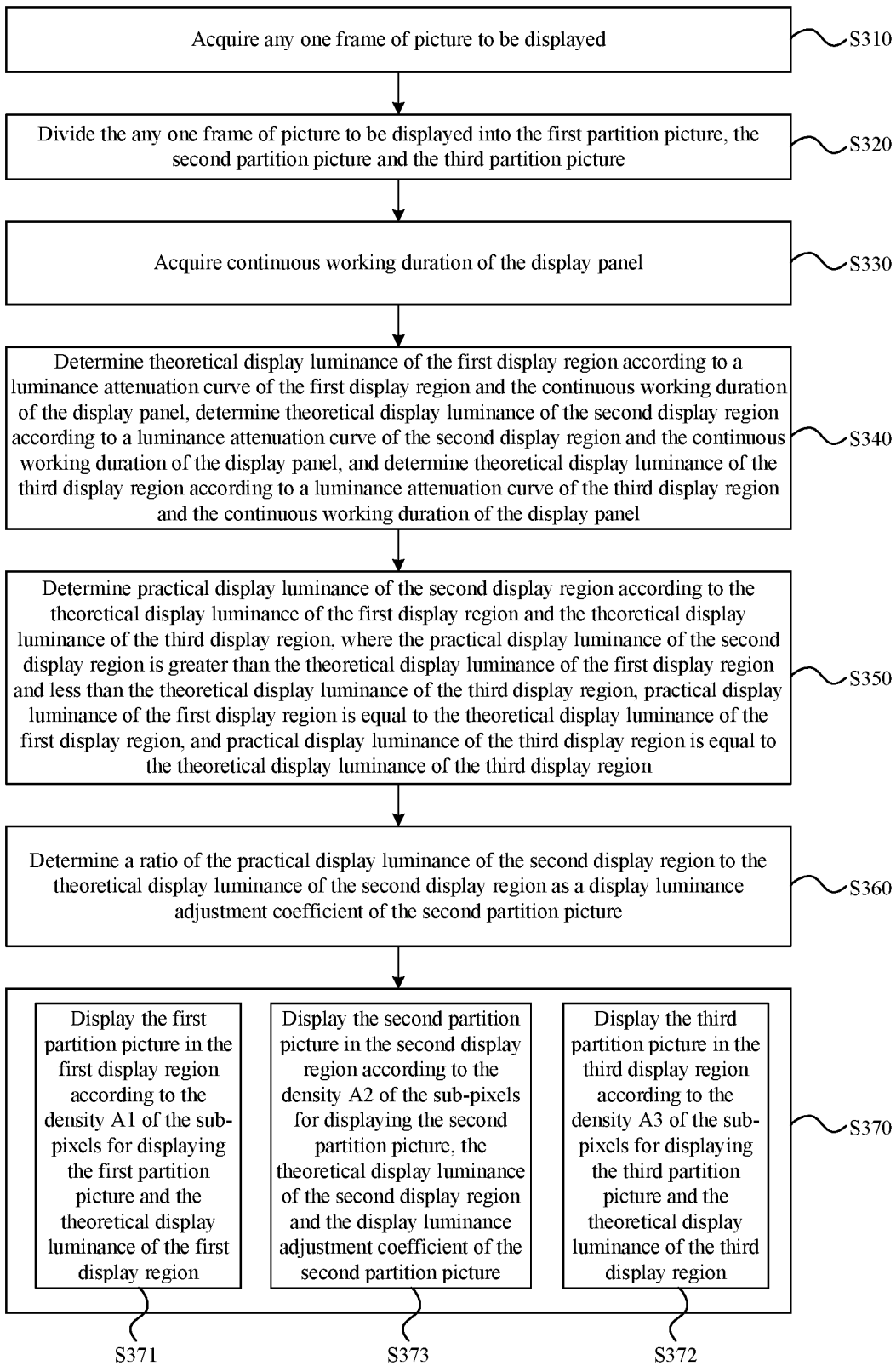
FIG. 18 is a flowchart of another driving method according to an embodiment of the present disclosure.

In conjunction with FIG. 16 and FIG. 17, the working process of the display panel when it is applied to a mobile terminal such as a mobile phone is described by using an example in which the first display mode is alternated with the second display mode within 1 s.

Exemplarily, referring to FIF. 16, among the M frames of the picture to be displayed in 1 s, a first frame to an $m_5$-th frame are displayed in the first display mode, and an $(m_5+1)$-th frame to an M-th frame are displayed in the second display mode. Driving algorithms of the display regions may be written into the IC in advance; where a driving algorithm used by the transition region may be referred to as a "compensation algorithm", and a driving algorithm used by the semi-transparent region or the normal display region may be referred to as an "algorithm for another region". The first display mode and the second display mode correspond to driving scheme 1 and driving scheme 2 respectively. In this case, the process of the method for driving a display panel is as shown in FIG. 17.

Referring to FIG. 17, the method for driving a display panel may include steps described below.

In S200, the method starts.

This step is an initial step for triggering a display of a current frame of the picture to be displayed.

Exemplarily, this step may be understood as a step in which the mobile terminal is powered on or a screen of the mobile terminal is lit from a black-screen state, or other steps known to those skilled in the art for triggering the display panel to display the picture to be displayed.

In S210, image data is inputted.

The image data refers to data information which is related to the picture to be displayed and transmitted by the driving system to the IC.

Exemplarily, the image data may include colors of pixel points in the picture to be displayed and corresponding grayscale values, and may include other types of image data known to those skilled in the art.

In S220, whether a region is the transition region is determined.

In this step, whether a region where the pixel points are located is the transition region is determined according to a correspondence between the pixel points and sub-pixel positions, so as to make preparations for different display regions to use different driving algorithms for image data processing in subsequent steps.

Exemplarily, the transition region is processed by the compensation algorithm for the transition region, and the semi-transparent region and the normal display region are processed by the algorithm for another region, that is, subsequent S230 and S232 are performed, so as to implement the transition of the display effect between the semi-transparent region and the normal display region by using the transition region.

If a determination result in S220 is yes (Y), a current region is the transition region, and S230 is performed.

In S230, the transition region is processed by the compensation algorithm.

A compensation method for the transition region may include using some sub-pixels in the transition region as the first sub-pixels, using remaining sub-pixels as the second sub-pixels, using the first sub-pixels to display the pixel points, and using the second sub-pixels to implement color cast compensation.

If the determination result in S220 is no (N), the current region is the semi-transparent region or the normal display region, the current region does not need to be compensated, and S232 is performed.

In S232, processing is performed by the algorithm for another region.

The algorithm for another region may include using all sub-pixels in the current region to display the pixel points, where the number of pixel points in the semi-transparent region is between the number of pixel points in the normal display region and the number of pixel points in the semi-transparent region.

If the determination result in S220 is yes (Y), and S230 is executed, subsequent steps related to the transition region further include S240, S250 and S252, so that among the M frames of picture to be displayed in 1 s, the first frame to the $m_5$-th frame are displayed in the first display mode, and the $(m_5+1)$-th frame to the M-th frame are displayed in the second display mode.

Exemplarily, S240 is performed after S230.

In S240, whether a frame is the first $m_5$ frames in 1 s is determined.

In this step, it is determined whether a current frame is any one of the first frame to the $m_5$-th frame of picture to be displayed.

If yes (Y), S250 is performed; if not (N), S252 is performed.

In S250, display driving scheme 1 for the transition region is performed.

In display driving scheme 1, the current frame is displayed in the first display mode. In this way, the first frame to the $m_5$-th frame may be displayed in the first display mode.

In S252, display driving scheme 2 for the transition region is performed.

In display driving scheme 2, the current frame is displayed in the second display mode. In this way, the $(m_5+1)$-th frame to the M-th frame may be displayed in the second display mode.

In S260, data is outputted.

Exemplarily, the data may include a scan signal and a data signal.

This step may include that the IC outputs the data to the sub-pixels through related circuit structures such as a data line, a scan line and the like. It is to be understood by those skilled in the art that a scanning driving circuit may be further disposed between the IC and the scan line, and the scanning driving circuit may include circuit structures such as a shift register. A demultiplexer circuit (Demux circuit) may be disposed between the IC and the data line to reduce the number of traces in a fan-out region, thereby reducing an area of a lower frame and improving the screen ratio. A pixel driving circuit may be disposed for sub-pixels; other circuit structures known to those skilled in the art may also be disposed in the display panel, and any one structure known to those skilled in the art may be used as a specific structure of each circuit structure, which are not described or limited in the embodiments of the present disclosure.

In S270, the picture is displayed.

In this step, the sub-pixels emit light according to the data configured for the sub-pixels to implement the display of the picture to be displayed.

In S280, the method ends.

At this point, the current picture to be displayed is presented, and one frame of picture to be displayed is displayed.

In this way, the driving method, by using the transition region, implements the transition of the display effect between the normal display region and the semi-transparent region, weakens the display boundary and improves the overall display effect of the display picture; meanwhile, different sub-pixels are used as the first sub-pixels in a former period of time (the first frame to the $m_5$-th frame) in 1 s and in a latter period of time (the $(m_5+1)$-th frame to the M-th frame) in 1 s, thereby prolonging the service life of the sub-pixels in the transition region.

In other embodiments, three or more display modes may also be configured for substitutions, which is not limited in the embodiments of the present disclosure.

It should be noted that FIG. 14 and FIG. 16 merely exemplarily show that the first frame within 1 s is displayed in the first display mode, and then the second display mode and the first display mode may be alternated. In other implementations, the first frame within 1 s may also be displayed in the second display mode, and then the first display mode and the second display mode may be alternated, which is not limited in the embodiments of the present disclosure.

Optionally, the at least two display modes include $n_1$ display modes, where each of the $n_1$ display modes is used for continuously displaying $m_4$ frames of picture to be displayed, where $M=n_1 * m_4$, $n_1 \geq 3$, and $n_1$ and $m_4$ each are positive integers.

With such a configuration, the utilization rate of the sub-pixels in the second display region may be improved, and a same number of frames are continuously displayed in different display modes, so that utilization rates of sub-pixels at different positions are more consistent, and usage lives of the sub-pixels are longer and more consistent; meanwhile, by setting that multiple frames of picture to be displayed are continuously displayed in a same display mode within 1 s, the display modes are alternated with one another fewer times, thereby reducing the driving difficulty and the power consumption.

Exemplarily, if $M=60$, $n_1=3$, and $m_4=20$, three display modes are used in 1 s, and each display mode may continuously display 20 frames of picture to be displayed. Exemplarily, the first 20 frames are displayed in the first display mode, the middle 20 frames are displayed in the second display mode, and the last 20 frames are displayed in the third display mode.

In other implementations, M, $n_1$ and $m_4$ may also be set to other values known to those skilled in the art, which are neither described nor limited in the embodiments of the present disclosure.

In other embodiments, it may be further set, according to the practical requirements of the display panel and the driving method thereof, that different numbers of frames are continuously displayed in different display modes within 1 s, which is not limited in the embodiments of the present disclosure.

In the embodiments described above, the method for driving a display panel in the embodiments of the present disclosure is exemplarily illustrated by using merely an example in which the sub-pixel arrangement manner of the second display region 520 is the same as that of the third display region 530. In other implementations, the sub-pixel arrangement manner of the second display region 520 may also be different from that of the third display region 530, and any one sub-pixel arrangement manner known to those skilled in the art may be used as the sub-pixel arrangement manners of the second display region 520 and the third display region 530 separately, which is neither described nor limited in the embodiments of the present disclosure.

It should be noted that the method for driving a display panel provided by the embodiments of the present disclosure may be applied to a real arrangement (that is, a real sub-pixel arrangement manner), a sub-pixel rendering (SPR) arrangement (that is, an SPR arrangement manner), or other sub-pixel arrangement manners known to those skilled in the art, which is neither described nor limited in the embodiments of the present disclosure.

In the embodiments described above, the density of the sub-pixels in the first display region for displaying the first partition picture, the density of the first sub-pixels in the second display region for displaying the second partition picture, and the density of the sub-pixels in the third display region for displaying the third partition picture are different from one another. In order to make the overall luminance of the display picture more uniform, display luminance of the sub-pixels in the first display region, the display luminance of the first sub-pixels in the second display region, and display luminance of the sub-pixels in the third display region need to be configured to be different from one another, and the smaller the density, the higher the display luminance.

In an example in which the display panel is the organic light emitting diode display panel, the light emitting element in the sub-pixel is an organic light emitting diode. The higher the display luminance of the organic light emitting diode, the greater driving current the organic light emitting diode requires; the greater the driving current, the more severe the performance of a film material in the light-emitting element decays, and thus the faster the luminance of the light emitting element decays.

Exemplarily, considering a (constant current test) life curve (that is, a luminance attenuation curve), after the display panel continuously works for a period of time, if the driving currents of the light emitting elements in the first display region, the second display region and the third display region remain consistent with the initial driving currents of the light emitting elements in the display regions, display luminance differences between the first partition picture, the second partition picture and the third partition picture will increase due to different attenuation degrees of the light emitting elements in their respective regions, affecting the overall display effect of the picture. The driving method provided in the embodiments of the present disclosure further includes performing luminance transition between the first partition picture and the third partition picture by using the second partition picture. Hereinafter, a luminance transition manner in the driving method is exemplarily described in conjunction with FIG. 18 to FIG. 22.

On the basis of the embodiments describe above, the display luminance of the sub-pixels in each display region may also be configured. Exemplarily, referring to FIG. 18, the driving method may include steps described below.

In S310, any one frame of picture to be displayed is acquired.

In S320, the picture to be displayed is divided into the first partition picture, the second partition picture and the third partition picture.

In S330, continuous working duration of the display panel is acquired.

The continuous working duration of the display panel may be understood as cumulative working time, that is, the continuous usage time of the display panel. The cumulative working time starts when the display panel is used for the first time to display the picture to be displayed after leaving the factory and ends up to the current frame of picture to be displayed.

Exemplarily, this step may include: accumulating and recording the continuous working duration of the display panel in the mobile terminal with a timer structure in the mobile terminal, and transmitting the continuous working duration to the IC to make preparations for subsequent steps.

In S340, theoretical display luminance of the first display region is determined according to a luminance attenuation curve of the first display region and the continuous working duration of the display panel. Theoretical display luminance of the second display region is determined according to a luminance attenuation curve of the second display region and the continuous working duration of the display panel; and theoretical display luminance of the third display region is determined according to a luminance attenuation curve of the third display region and the continuous working duration of the display panel.

The theoretical display luminance of each display partition may be separately determined according to the luminance attenuation curve and the continuous working duration. The luminance attenuation curve of each display partition may be obtained in a test stage before the display panel leaves the factory and stored in the IC to be called in this step.

It is to be understood that a luminance change trend of the display partition is consistent with a luminance change trend of the light emitting element in the display partition. Hereinafter, this step is exemplarily described by using the luminance attenuation curves of the display regions as examples in conjunction with FIG. 19 and FIG. 20.

Figure 19:
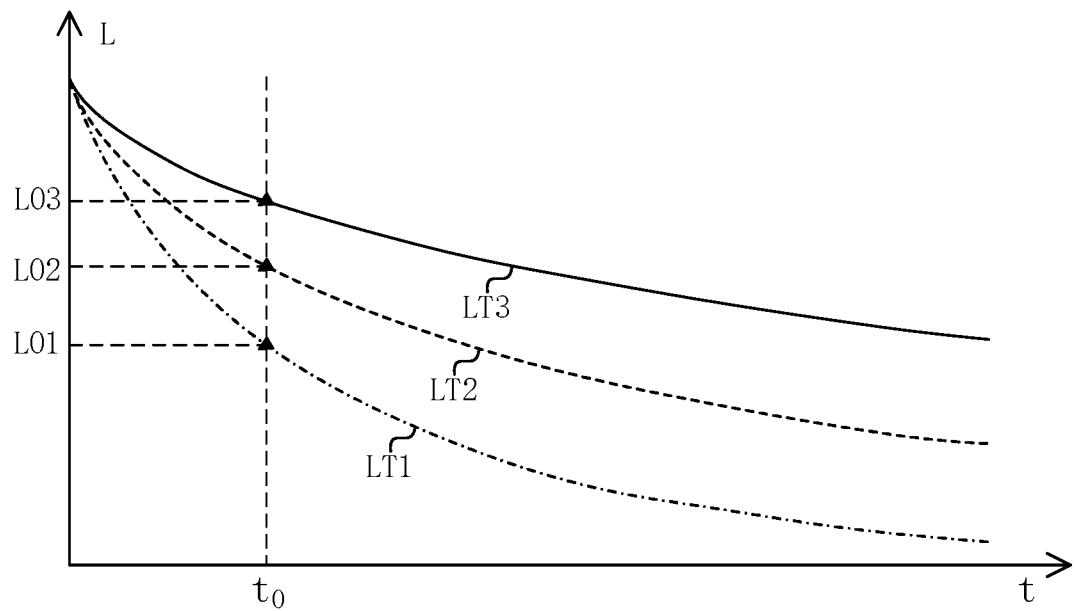
FIG. 19 is a schematic diagram of a luminance attenuation curve according to an embodiment of the present disclosure.
Figure 20:
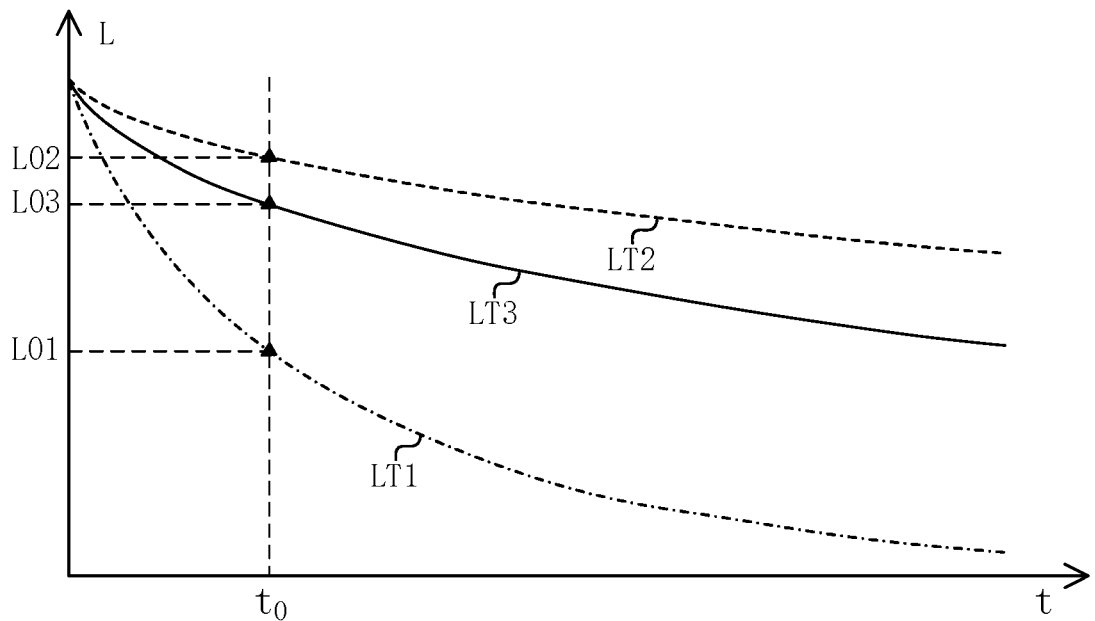
FIG. 20 is a schematic diagram of another luminance attenuation curve according to an embodiment of the present disclosure.

Exemplarily, FIG. 19 and FIG. 20 show two types of luminance attenuation curve of the display regions separately. Referring to FIG. 19 or FIG. 20, an abscissa t represents the continuous usage time of the display panel, and an ordinate L represents the theoretical display luminance of each display partition of the display panel; LT1, LT2 and LT3 represent the luminance attenuation curves of the first display region, the second display region and the third display region respectively; the closer the luminance attenuation curve is to a horizontal axis, the more severe the luminance attenuation of the display partition; to represents the continuous usage time of the display panel, and L01, L02, and L03, the ordinates L at the abscissa of to, represent the theoretical display luminance of the first display region, the second display region and the third display region respectively.

The similarity of luminance attenuation curves in FIG. 19 and FIG. 20 lies in that the luminance attenuation curve LT1 of the first display region is closer to the horizontal axis than the luminance attenuation curve LT3 of the third display region, that is, the luminance attenuation of the first display region is the most severe. The differences between the luminance attenuation curves in FIG. 19 and FIG. 20 are described below.

In FIG. 19, the luminance attenuation curve LT2 of the second display region is between the luminance attenuation curve LT1 of the first display region and the luminance attenuation curve LT3 of the third display region, that is, a luminance attenuation degree of the second display region is between a luminance attenuation degree of the first display region and a luminance attenuation degree of the third display region. A position relationship of these curves may be understood as a change law for the luminance attenuation of the display regions of the display panel when the second display region adopts merely one display mode for the display.

In FIG. 20, the luminance attenuation curve LT2 of the second display region is farther away from the horizontal axis than the luminance attenuation curve LT3 of the third display region, that is, the luminance attenuation degrees of the three display regions are sequentially, in an ascending order, the luminance attenuation degree of the second display region, the luminance attenuation degree of the third display region and the luminance attenuation degree of the first display region. The position relationship of these curves may be understood as a change law for the luminance attenuation of the display regions of the display panel when the second display region adopts at least two alternate display modes for the display.

It is to be understood that when the second display region adopts the at least two alternate display modes for displaying the second partition picture, the sub-pixel at each position in the second display region may be alternately used as the first sub-pixel and the second sub-pixel, and the second sub-pixels decay extremely slow because light emitting luminance of the second sub-pixels is extremely low relative to the light emitting luminance of the first sub-pixels. Exemplarily, in an extreme case where the second sub-pixels do not perform the display, i.e., the display luminance of the second sub-pixels is 0, when the sub-pixel is used as the second sub-pixel, the luminance of the sub-pixel does not decay. Therefore, the cumulative working time of each sub-pixel in the second display region is smaller than the continuous usage time of the display panel, so that the overall luminance attenuation degree of the second display region is the smallest.

The theoretical display luminance of each display partition is obtained in this step to make preparations for determining practical display luminance of each display partition in the subsequent step.

In S350, practical display luminance of the second display region is determined according to the theoretical display luminance of the first display region and the theoretical display luminance of the third display region, where the practical display luminance of the second display region is greater than the theoretical display luminance of the first display region and less than the theoretical display luminance of the third display region, practical display luminance of the first display region is equal to the theoretical display luminance of the first display region, and practical display luminance of the third display region is equal to the theoretical display luminance of the third display region.

The first display region and the third display region respectively use their respective theoretical display luminance as their respective practical display luminance which does not need to be calculated, and thus the driving algorithms may be simpler.

The practical display luminance of the second display region is between the practical display luminance of the first display region and the practical display luminance of the third display region, so that the luminance transition between the first display region and the third display region may be implemented, and the problem of a greater display luminance difference is avoided.

Exemplarily, the practical display luminance of the second display region may be an average value of the theoretical display luminance of the first display region and the practical display luminance of the third display region, so as to more effectively implement the luminance transition between the first display region and the third display region.

In other embodiments, the practical display luminance of the second display region may also be another luminance value between the theoretical display luminance of the first display region and the practical display luminance of the third display region, and may be set according to the practical requirements of the display panel and the driving method thereof, which is not limited in the embodiments of the present disclosure.

In S360, a ratio of the practical display luminance of the second display region to the theoretical display luminance of the second display region is determined as a display luminance adjustment coefficient of the second partition picture.

The display luminance adjustment coefficient is used for adjusting the theoretical display luminance of the second display region as the practical display luminance of the second display region.

Exemplarily, referring to FIG. 19 and FIG. 20, when the luminance attenuation curve of the second display region is not between the luminance attenuation curve of the first display region and the luminance attenuation curve of the third display region, the display luminance adjustment coefficient is used for adjusting the practical display luminance of the second display region to be between the practical display luminance of the first display region and the practical display luminance of the third display region.

It should be noted that when the second display region includes multiple second display sub-regions, the practical display luminance of each second display sub-region may also be configured to be between the practical display luminance of the first display region and the practical display luminance of the third display region, and the practical display luminance sequentially becomes higher along a direction in which the first display region points to the third display region, and specific luminance may be set according to the practical requirements of the display panel and the driving method thereof, which is not limited in the embodiments of the present disclosure.

Then, S370 is performed, and S370 may include S371, S372 and S373.

In S371, the first partition picture is displayed in the first display region according to the density A1 of the sub-pixels for displaying the first partition picture and the theoretical display luminance of the first display region.

In this way, the first partition picture is displayed by the sub-pixels in the first display region.

In S372, the third partition picture is displayed in the third display region according to the density A3 of the sub-pixels for displaying the third partition picture and the theoretical display luminance of the third display region.

In this way, the third partition picture is displayed by the sub-pixels in the third display region.

In S373, the second partition picture is displayed in the second display region according to the density A2 of the sub-pixels for displaying the second partition picture, the theoretical display luminance of the second display region and the display luminance adjustment coefficient of the second partition picture.

In this way, by adjusting the theoretical display luminance of the sub-pixels in the second display region, the second partition picture can be displayed by the first sub-pixels and the second sub-pixels in the second display region.

The second display region may not only implement the transition of the number of display pixel points between the first display region and the third display region but also implement the transition of the display luminance between the first display region and the third display region. Therefore, the transition of the display effect between the first display region and the third display region can be implemented by using the second display region, and the overall display effect of the display picture can be improved.

In other embodiments, the continuous usage time of the display panel may be divided, different display luminance adjustment coefficients are used in different time periods, and a same display luminance adjustment coefficient is used in a same time period, so as to reduce the number of display luminance adjustment coefficients, thereby facilitating the simplification of the driving algorithm.

Exemplarily, the display luminance adjustment coefficients in different time periods may be written into the IC to be called in the working process of the display panel.

Hereinafter, the driving method will be exemplarily described in conjunction with FIG. 21 and FIG. 22.

Figure 21:
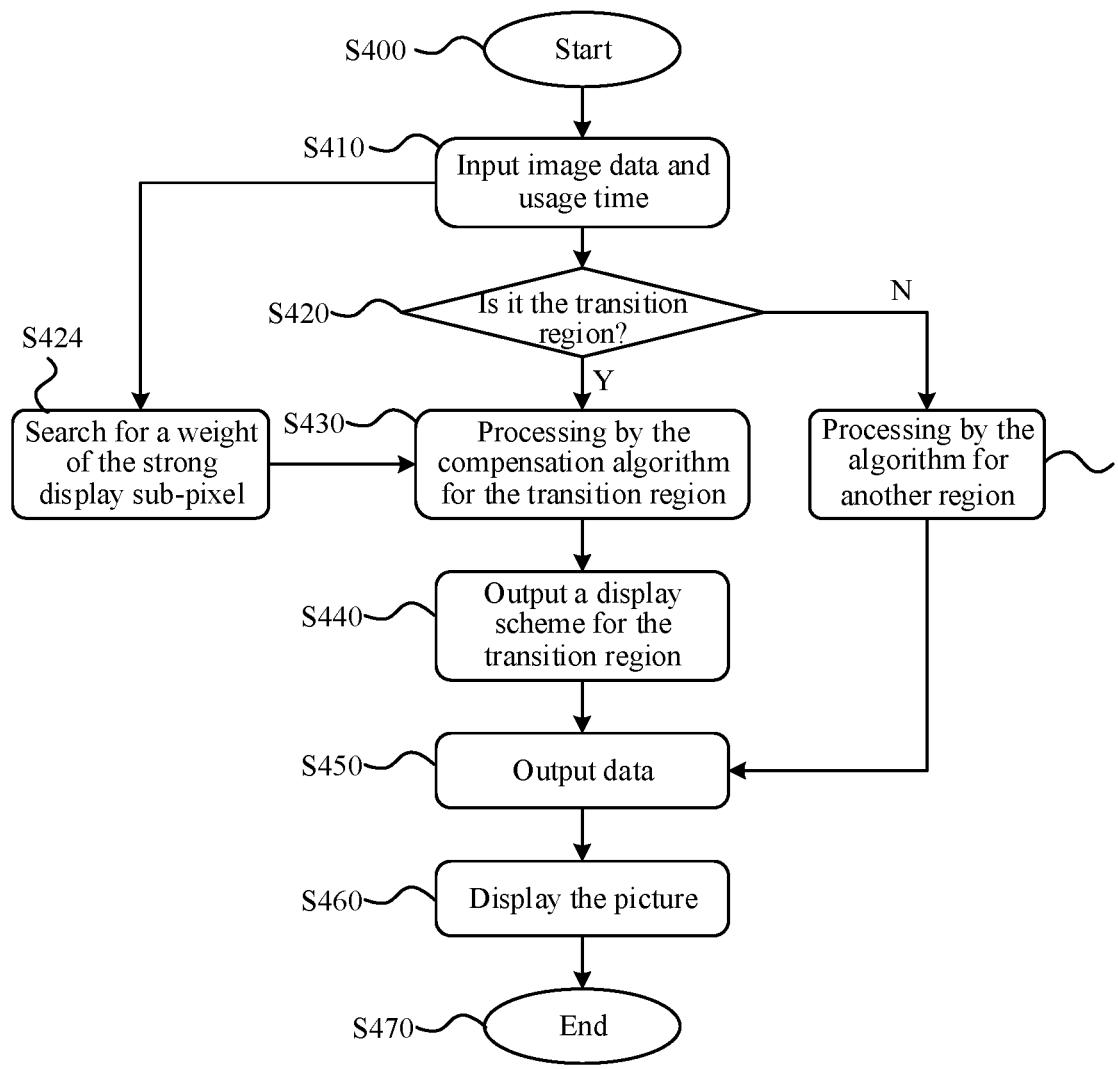
FIG. 21 is a schematic flowchart of another driving method according to an embodiment of the present disclosure.
Figure 22:
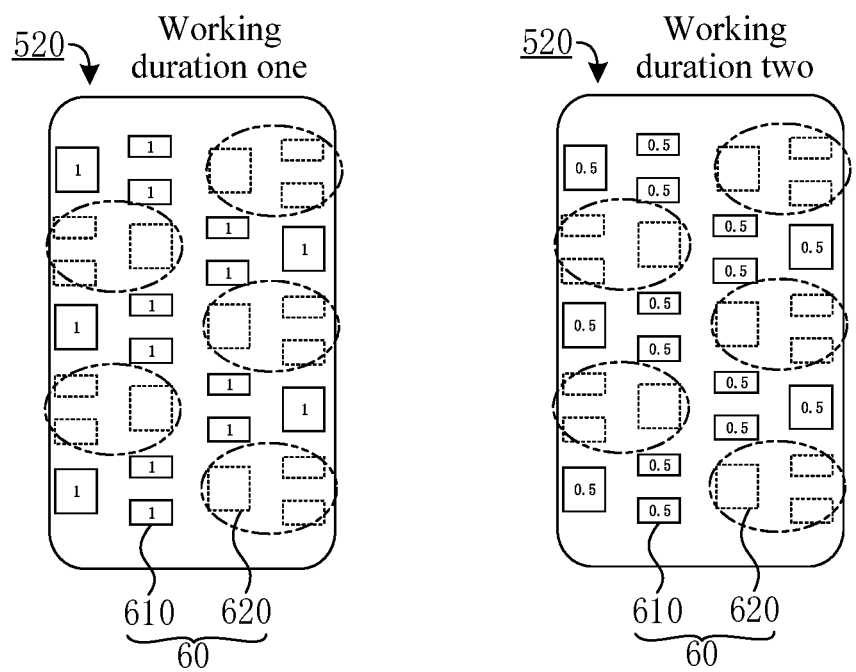
FIG. 22 is a contrast diagram of a display panel under different working duration according to an embodiment of the present disclosure.

Referring to FIG. 21, the process of the driving method may include steps described below.

In S400, the method starts.

In S410, image data and usage time are inputted.

The usage time is the continuous working duration of the display panel.

Exemplarily, this step may include that the IC acquires the image data and the continuous usage time of the display panel by the driving system (including the timer structure).

In S420, it is determined whether the region is the transition region.

In S424, a weight of the strong display sub-pixel is search for.

In this step, the weak display sub-pixel does not perform the display by default. The weight, which may also be referred to as a weight coefficient, is the display luminance adjustment coefficient.

Exemplarily, in this step, the weight may be obtained by looking up a table. Exemplarily, Table 1 shows the weight coefficient.

TABLE 1

| Weight coefficient table | |
|---|---|
| Usage Time of the Display Panel | Weight of the Strong Display Sub-pixel |
| T1--T2 | R: k11 |
|  | G: k12 |
|  | B: k13 |
| T2--T3 | R: k21 |
|  | G: k22 |
|  | B: k23 |
| T3--T4 | R: k31 |
|  | G: k32 |
|  | B: k33 |

Exemplarily, in Table 1, the (continuous) usage time of the display panel is divided into three time periods which are T1-T2, T2-T3, and T3-T4 separately, and the weights of the strong display sub-pixels in each time period are shown by using an example in which the sub-pixel includes sub-pixels of three different colors, red (R), green (G) and blue (B).

In other embodiments, a number of time periods, duration of each time period, display colors of the sub-pixels, and values of weight coefficients of the sub-pixels of different display colors may all be set according to the practical requirements of the display panel and the driving method thereof, which are not limited in the embodiments of the present disclosure.

In this way, this step makes preparations for S430.

In S430, the transition region is processed by the compensation algorithm.

This step may implement the transition of the number of pixel points and the display luminance between the semi-transparent region and the normal display region by using the transition region through data processing based on the weight coefficients searched for in S424.

In S432, processing is performed by the algorithm for another region.

In S440, a display scheme for the transition region is outputted.

Exemplarily, this step may include outputting the display scheme corresponding to the driving algorithm after the number of display pixel points and the display luminance are integrated.

Exemplarily, FIG. 21 shows display schemes for the transition regions for two different kinds of working durations. Exemplarily, the display scheme are shown by a display scheme for the transition region for "working duration one" and a display scheme for the transition region for "working duration two" separately. The sub-pixels circled by the dotted line are the second sub-pixels, and the sub-pixels with solid contour lines are the first sub-pixels. The weight coefficient of all the first sub-pixels is 1 in working duration one, and the weight coefficient of all the first sub-pixels is 0.5 in working duration two, thereby implementing the time-based adjustment of the practical display luminance.

In S450, data is outputted.

Exemplarily, this step includes outputting the image data for the transition region, the semi-transparent region and the normal display region to the sub-pixels after the image data is processed in S420 to S440.

In S460, the picture is displayed.

In S470, the method ends.

In this way, the algorithm for the transition region is adjusted for strong and weak displays according to changes of the usage lives of the semi-transparent region, the transition region and the normal display region with the usage time and the usage time of the display panel recorded by the mobile terminal, reducing the difference between display effects due to the different between the usage lives of the semi-transparent region and the normal display region, and thereby improving the overall display effect of the display panel.

In other embodiments, at an initial usage stage of the display panel, since luminance attenuation differences of the display regions are small, and the human eyes cannot observe differences of the practical display luminance between the display regions, luminance adjustment may not be performed, thereby facilitating the simplification of the driving algorithm. With the increase of the usage time, the display luminance differences between different display regions are increasingly greater, and when the luminance differences are visually visible, luminance compensation needs to be performed by using the weight coefficients.

It should be noted that the duration of the initial usage stage needs to be set according to the practical display requirements of the display panel, which is not limited in the embodiments of the present disclosure.

Based on a same inventive concept, the embodiments of the present disclosure further provide a display driving device. The display driving device may be configured to perform the driving method according to the above-mentioned embodiments. Therefore, the display driving device also has the beneficial effects of the method for driving a display panel according to the above-mentioned embodiments, and the same content is not repeated hereinafter and may be understood by referring to the above description.

Figure 23:
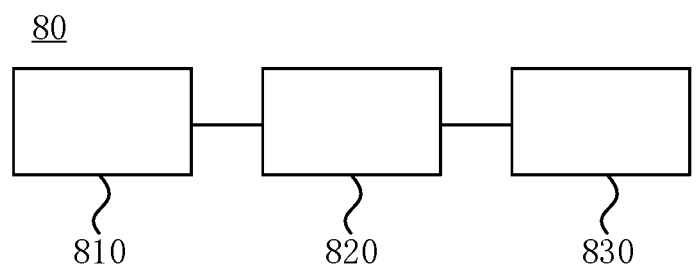
FIG. 23 is a structure diagram of a display driving device according to an embodiment of the present disclosure.

Exemplarily, referring to FIG. 23, a display driving device 80 may include a picture acquisition module 810, a region division module 820 and a picture display module 830. The acquisition module 810 is configured to acquire any one frame of picture to be displayed. The region division module 820 is configured to divide the any one frame of picture to be displayed into a first partition picture, a second partition picture and a third partition picture. The picture display module 830 is configured to display the first partition picture in a first display region, display the second partition picture in a second display region, and display the third partition picture in a third display region.

In the same frame of the picture to be displayed, a density A1 of sub-pixels for displaying the first partition picture, a density A2 of sub-pixels for displaying the second partition picture and a density A3 of sub-pixels for displaying the third partition picture satisfy that $A1<A2\leq A3$; sub-pixels in the second display region include first sub-pixels and second sub-pixels, where display luminance L21 of the first sub-pixels and display luminance L22 of the second sub-pixels satisfy that $L21>L22$, so that the density A2 of the sub-pixels for displaying the second partition picture is between the density A1 of the sub-pixels for displaying the first partition picture and the density A3 of the sub-pixels for displaying the third partition picture, thereby implementing the transition between the first partition picture and the third partition picture by using the density of the sub-pixel for displaying the second partition picture. Meanwhile, the sub-pixels in the second display region may include the first sub-pixels (i.e., strong display sub-pixels) with higher display luminance and the second sub-pixels (i.e., weak display sub-pixels) with lower display luminance, and display luminance and an arrangement density of the strong display sub-pixels and the weak display sub-pixels are set, thereby implementing the transition of a picture display effect between the first partition picture and the third partition picture by using the sub-pixels for displaying the second partition picture. In summary, the second display region may be used for implementing the transition of the display effect, that is, for weakening a boundary between picture partitions, thereby implementing the transition of the display luminance and a display picture quality of the picture to be displayed and further improving the overall display quality of the display picture.

Figure 24:
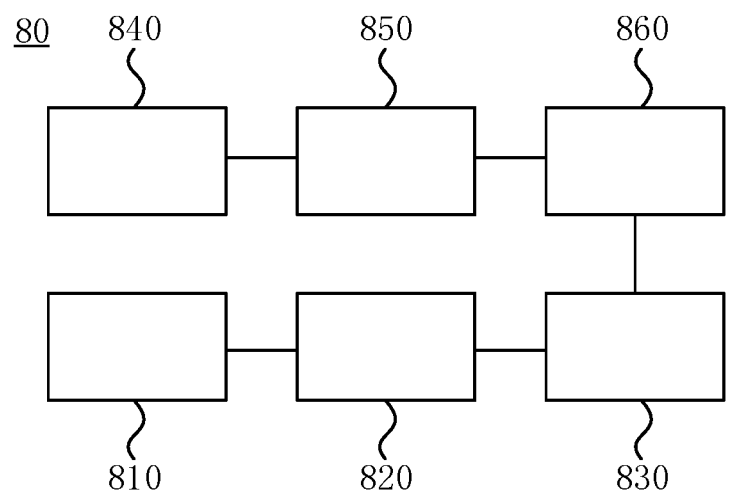
FIG. 24 is a structure diagram of another display driving device according to an embodiment of the present disclosure.

Exemplarily, referring to FIG. 24, the display driving device 80 may further include a duration acquisition module 840, a theoretical luminance determination module 850 and a display luminance determination module 860. The duration acquisition module 840 is configured to acquire continuous working duration of the display panel. The theoretical luminance determination module 850 is connected to the duration acquisition module 840 and is configured to determine theoretical display luminance of the first display region according to a luminance attenuation curve of the first display region and the continuous working duration of the display panel, determine theoretical display luminance of the second display region according to a luminance attenuation curve of the second display region and the continuous working duration of the display panel, and determine theoretical display luminance of the third display region according to a luminance attenuation curve of the third display region and the continuous working duration of the display panel. The display luminance determination module 860 is connected to the theoretical luminance determination module 850 and is configured to determine practical display luminance of the second display region according to the theoretical display luminance of the first display region and the theoretical display luminance of the third display region, where the practical display luminance of the second display region is greater than the theoretical display luminance of the first display region and less than the theoretical display luminance of the third display region, practical display luminance of the first display region is equal to the theoretical display luminance of the first display region, and practical display luminance of the third display region is equal to the theoretical display luminance of the third display region.

In this way, preparations can be made for implementing the luminance transition based on continuous usage time of the display panel in conjunction with the luminance attenuation curve of each display partition.

Optionally, in FIG. 24, the picture display module 830 is further configured to: in the same frame of the picture to be displayed, display the first partition picture in the first display region according to the density A1 of the sub-pixels for displaying the first partition picture and the theoretical display luminance of the first display region, display the third partition picture in the third display region according to the density A3 of the sub-pixels for displaying the third partition picture and the theoretical display luminance of the third display region, and display the second partition picture in the second display region according to the density A2 of the sub-pixels for displaying the second partition picture, the theoretical display luminance of the second display region and a display luminance adjustment coefficient of the second partition picture.

In this way, the transition of the display luminance can be implemented while the transition of the number of pixel points is implemented, and thus the overall display effect of the display picture can be improved.

It should be noted that in the structural diagrams of the display driving device 80 shown in FIG. 23 and FIG. 24, the modules are merely exemplarily divided according to their functions, and a signal transmission relationship of the modules is indicated by connection lines. In a practical product, spatial positions of the modules may overlap, and signal transmission between the modules may be wired transmission or wireless transmission, which are not limited in the embodiments of the present disclosure.

It should be emphasized that the various embodiments in the present application can be implemented in free combination without being mutually exclusive, for example, a combination of different display panel structures and driving manners.

On the basis of the above-mentioned embodiments, embodiments of the present disclosure further provide an electronic device. The electronic device includes any one of the display driving devices according to the above-mentioned embodiments. Therefore, the display device also has the beneficial effects of the display driving devices according to the above-mentioned embodiments, and the same content is not repeated hereinafter and may be understood with reference to the above description.

Figure 25:
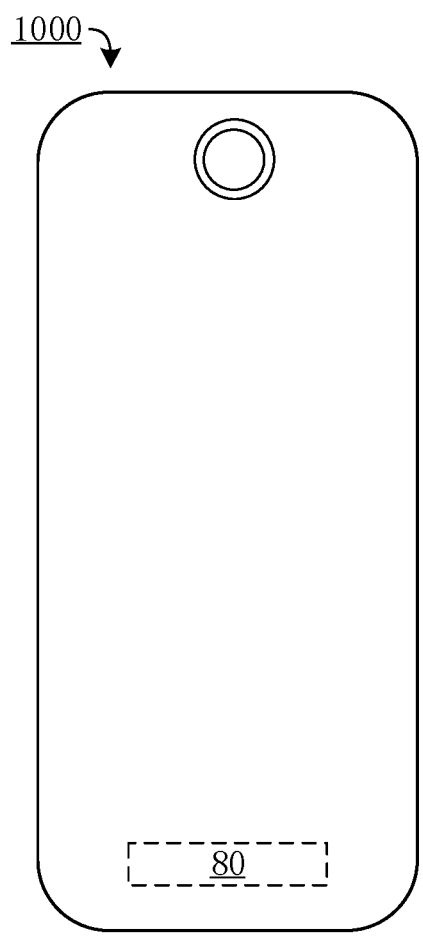
FIG. 25 is a structural view of an electronic device according to an embodiment of the present disclosure.

Exemplarily, referring to FIG. 25, an electronic device 1000 includes the display driving device 80 according to the above-mentioned embodiments, where some modules in the driving method performed by the display driving device 80 may be integrated into a driving chip of the display panel, or the display driving device 80 may be independently disposed from a display panel, and signals may be transmitted between the display driving device 80 and the display panel through electrical connection lines, which is not limited in the embodiments of the present disclosure.

Exemplarily, the electronic device 1000 may be a mobile phone, a computer, a smart wearable device (for example, a smart watch) a vehicle-mounted display screen, a vehicle-mounted touch screen, or other electronic devices known to those skilled in the art, which is not limited in the embodiments of the present disclosure.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A method for driving a display panel, wherein the display panel comprises a first display region, a second display region and a third display region; wherein the second display region is disposed between the first display region and the third display region, and at least part of the first display region is reused as an optical element reserved region; and wherein the method comprises:

acquiring one frame of picture to be displayed;

dividing the frame of picture to be displayed into a first partition picture, a second partition picture and a third partition picture; and displaying the first partition picture in the first display region, displaying the second partition picture in the second display region, and displaying the third partition picture in the third display region;

wherein in response to displaying the second partition picture, sub-pixels in the second display region comprise first sub-pixels having display luminance L21 and second sub-pixels having display luminance L22, and L21>L22;

wherein the first display region comprises a plurality of first light emitting elements, the second display region comprises a plurality of second light emitting elements, and the third display region comprises a plurality of third light emitting elements; and wherein the display panel comprises a plurality of first pixel circuits, a plurality of second pixel circuits, and a plurality of third pixel circuits, each first pixel circuit of the plurality of first pixel circuits is electrically connected to at least one of the plurality of first light emitting elements, each second pixel circuit of the plurality of second pixel circuits is electrically connected to at least one of the plurality of second light emitting elements, and each third pixel circuit of the plurality of third pixel circuits is electrically connected to at least one of the plurality of third light emitting elements;

wherein each of the plurality of first light emitting elements comprises a first anode, and each of the plurality of third light emitting elements comprises a third anode; and wherein in a case where a first light emitting element and a third light emitting element emit a same color, an area of the first anode of the first light emitting element is smaller than an area of the third anode of the third light emitting element.

2. The method of claim 1, wherein the acquiring the frame of picture to be displayed comprises acquiring a first to-be-displayed picture having a first grayscale, wherein luminance J1 of the first display region per unit area, luminance J2 of the second display region per unit area, and luminance J3 of the third display region per unit area satisfy that J1<J2<J3.

3. The method of claim 1, wherein the acquiring the frame of picture to be displayed comprises acquiring a second to-be-displayed picture having a second grayscale, wherein luminance J1 of the first display region per unit area, luminance J2 of the second display region per unit area, and luminance J3 of the third display region per unit area satisfy that J1>J2>J3.

4. The method of claim 1, wherein an arrangement density of the plurality of first light emitting elements is equal to an arrangement density of the plurality of second light emitting elements, and the arrangement density of the plurality of second light emitting elements is less than or equal to an arrangement density of the plurality of third light emitting elements.

5. The method of claim 1, wherein an arrangement density of the plurality of first light emitting elements is less than an arrangement density of the plurality of second light emitting elements, and the arrangement density of the plurality of second light emitting elements is less than or equal to an arrangement density of the plurality of third light emitting elements.

6. The method of claim 1, wherein at least one of the plurality of first pixel circuits is disposed in the second display region.

7. The method of claim 1, wherein the each first pixel circuit comprises a first number of transistors, and the each third pixel circuit comprises a third number of transistors, wherein the first number is less than the third number.

8. The method of claim 1, wherein along a direction perpendicular to a plane where the display panel is located, a projection area of the each first pixel circuit is smaller than a projection area of the each third pixel circuit.

9. The method of claim 1, further comprising: acquiring any one frame of picture to be displayed;
wherein in a same frame of picture to be displayed, a density A1 of sub-pixels for displaying the first partition picture, a density A2 of sub-pixels for displaying the second partition picture and a density A3 of sub-pixels for displaying the third partition picture satisfy that A1≤A2≤A3.

10. The method of claim 1, wherein
the second partition picture comprises N second sub-partition pictures, wherein the N second sub-partition pictures are sequentially arranged along a preset direction between the first partition picture and the third partition picture, wherein the preset direction is a direction of the second partition picture away from the third partition picture; and wherein the second display region comprises N second display sub-regions, wherein the N second display sub-regions are in a one-to-one correspondence with the N second sub-partition pictures, wherein N is a positive integer greater than 1;
densities of the first sub-pixels corresponding to the N second sub-partition pictures are reduced along the preset direction between the first partition picture and the third partition picture;
in the same frame of picture to be displayed, along the preset direction, a density of the first sub-pixels for displaying a first one of the N second sub-partition pictures is less than the density of the sub-pixels for displaying the third partition picture, and a density of the first sub-pixels for displaying an N-th one of the N second sub-partition pictures is greater than the density of the sub-pixels for displaying the first partition picture.

11. The method of claim 10, wherein the first sub-pixels for displaying each of the N second sub-partition pictures are uniformly distributed in a respective one of the N second display sub-regions.

12. The method of claim 10, wherein the densities of the first sub-pixels corresponding to the N second sub-partition pictures are in an arithmetic progression along the preset direction between the first partition picture and the third partition picture.

13. The method of claim 1, wherein the first sub-pixels for displaying the second partition picture are uniformly distributed in the second display region.

14. The method of claim 1, wherein the display panel displays M frames of picture to be displayed per second, wherein M is a positive integer greater than 1; and
at least two display modes are used per second, wherein at least one of the M frames of picture to be displayed is continuously displayed in each of the at least two display modes; wherein
the first sub-pixels in the second display region for displaying the second partition picture of each frame of picture to be displayed in a same display mode have the same positions; and
the first sub-pixels in the second display region for displaying the second partition picture of frames of picture to be displayed in different display modes have at least partially different positions.

15. The method of claim 14, wherein the at least two display modes comprise a first display mode and a second display mode, wherein positions of the first sub-pixels in the second display region for displaying the each frame of picture to be displayed in the first display mode are different from positions of the first sub-pixels in the second display region for displaying the each frame of picture to be displayed in the second display mode, a part of the sub-pixels in the second display region are used as the first sub-pixels in the first display mode, and remaining sub-pixels in the second display region except the part of the sub-pixels are used as the first sub-pixels in the second display mode; and each of the first display mode and the second display mode displays one frame of picture to be displayed; and
wherein an $m_1$-th frame of picture to be displayed is displayed in the first display mode, and an $(m_1+1)$-th frame of picture to be displayed is displayed in the second display mode;
wherein $1 \leq m_1 < m_1+1 \leq M$, and $m_1$ is an integer.

16. The method of claim 14, wherein the at least two display modes comprise a first display mode and a second display mode, wherein positions of the first sub-pixels in the second display region for displaying the each frame of picture to be displayed in the first display mode are different from positions of the first sub-pixels in the second display region for displaying the each frame of picture to be displayed in the second display mode, a part of the sub-pixels in the second display region are used as the first sub-pixels in the first display mode, and remaining sub-pixels in the second display region except the part of the sub-pixels are used as the first sub-pixels in the second display mode; and
wherein an $m_2$-th frame of picture to be displayed to an $m_3$-th frame of picture to be displayed are displayed in the first display mode, and an $(m_3+1)$-th frame of picture to be displayed to a $(2m_3-m_2+1)$-th frame of picture to be displayed are displayed in the second display mode;
wherein $1 \leq m_2 < m_3 \leq M$, and $m_2$ and $m_3$ are integers.

17. The method of claim 14, wherein the at least two display modes comprise $n_1$ display modes, wherein each of the $n_1$ display modes is used for continuously displaying $m_4$ frames of picture to be displayed;

wherein M=$n_1 * m_4$, $n_1 \geq 3$, and $n_1$ and $m_4$ are positive integers.

18. The method of claim 1, wherein the display luminance L22 of the second sub-pixels is equal to 0.

19. A display driving device, configured to perform the method for driving a display panel of claim 1, wherein the display driving device comprises:
   a picture acquisition circuit, which is configured to acquire any one frame of picture to be displayed;
   a region division circuit, which is configured to divide the any one frame of picture to be displayed into a first partition picture, a second partition picture and a third partition picture; and
   a picture display circuit, which is configured to display the first partition picture in the first display region, display the second partition picture in the second display region, and display the third partition picture in the third display region.

20. The method of claim 1, wherein the first sub-pixels having display luminance L21 and the second sub-pixels having display luminance L22 have a same gray scale.

21. A method for driving a display panel, wherein the display panel comprises a first display region, a second display region and a third display region; wherein the second display region is disposed between the first display region and the third display region, and at least part of the first display region is reused as an optical element reserved region; and
   wherein the method comprises:
   acquiring one frame of picture to be displayed;
   dividing the frame of picture to be displayed into a first partition picture, a second partition picture and a third partition picture; and
   displaying the first partition picture in the first display region, displaying the second partition picture in the second display region, and displaying the third partition picture in the third display region;
   wherein in response to displaying the second partition picture, sub-pixels in the second display region comprise first sub-pixels having display luminance L21 and second sub-pixels having display luminance L22, and L21>L22;
   wherein the first display region comprises a plurality of first light emitting elements, the second display region comprises a plurality of second light emitting elements, and the third display region comprises a plurality of third light emitting elements; and
   wherein the display panel comprises a plurality of first pixel circuits, a plurality of second pixel circuits, and a plurality of third pixel circuits, each first pixel circuit of the plurality of first pixel circuits is electrically connected to at least one of the plurality of first light emitting elements, each second pixel circuit of the plurality of second pixel circuits is electrically connected to at least one of the plurality of second light emitting elements, and each third pixel circuit of the plurality of third pixel circuits is electrically connected to at least one of the plurality of third light emitting elements;
   wherein at least one of the plurality of first pixel circuits is disposed in the second display region.

* * * * *